United States Patent
Yuan et al.

(10) Patent No.: US 9,012,938 B2
(45) Date of Patent: Apr. 21, 2015

(54) HIGH REFLECTIVE SUBSTRATE OF LIGHT EMITTING DEVICES WITH IMPROVED LIGHT OUTPUT

(75) Inventors: Thomas Cheng-Hsin Yuan, Ventura, CA (US); Bernd Keller, Santa Barbara, CA (US); Ronan Le Toquin, Ventura, CA (US); Theodore Lowes, Lompoc, CA (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 12/757,179

(22) Filed: Apr. 9, 2010

(65) Prior Publication Data

US 2011/0248287 A1    Oct. 13, 2011

(51) Int. Cl.
*H01L 33/00* (2010.01)
*H01L 33/60* (2010.01)
*H01L 25/075* (2006.01)

(52) U.S. Cl.
CPC ............ *H01L 33/60* (2013.01); *H01L 25/0753* (2013.01); *H01L 2924/0002* (2013.01)

(58) Field of Classification Search
USPC ........ 257/88, 98, 99, 100, E33.059, E33.061, 257/E33.072
See application file for complete search history.

(56) References Cited

U.S. PATENT DOCUMENTS

| | | | | |
|---|---|---|---|---|
| 1,393,573 A | 10/1921 | Ritter | ............................ | 362/509 |
| 1,880,399 A | 10/1932 | Benjamin | .................... | 362/277 |
| 2,214,600 A | 9/1940 | Winkler | ........................ | 362/279 |
| 2,981,827 A | 4/1961 | Orsatta | ........................... | 362/84 |
| 3,395,272 A | 7/1968 | Nicholl | ......................... | 362/305 |
| 3,760,237 A | 9/1973 | Jaffe | ............................... | 257/98 |

(Continued)

FOREIGN PATENT DOCUMENTS

| | | |
|---|---|---|
| CN | 2498694 | 7/2002 |
| CN | 2617039 Y | 5/2004 |

(Continued)

OTHER PUBLICATIONS

First Office Action for Chinese Patent Application No. CN 200710152109.7 issued Jul. 29, 2011.

(Continued)

*Primary Examiner* — Victor A Mandala
(74) *Attorney, Agent, or Firm* — Koppel, Patrick, Heybl & Philpott

(57) ABSTRACT

Apparatuses and methods for producing light emitting devices maximizing luminous flux output are disclosed. In one possible embodiment, a light emitting device comprises a substrate and a reflective layer at least partially covering the substrate. The reflective layer is non-yellowing, and may be substantially light transparent. One or more light emitting diode (LED) chips are disposed on the substrate. The light emitting device may emit white light. The reflective layer may comprise a silicone carrier with light reflective particles dispersed in the silicone carrier. A light diffusion lens may also be disposed on the substrate and surrounding the LED chips. Furthermore, one or more microspheres, light scattering particles, and/or phosphor particles may be dispersed in the lens. In one possible method for producing a light emitting device, a substrate is provided. One or more LED chips are coupled with the substrate, and a high reflective, non-yellowing coating is applied on at least a portion of the top surface of the substrate. The coating comprises a carrier with reflective particles dispersed throughout.

32 Claims, 4 Drawing Sheets

(56) References Cited

U.S. PATENT DOCUMENTS

| | | | |
|---|---|---|---|
| 4,307,297 A | 12/1981 | Groff | |
| 4,420,800 A | 12/1983 | Van Horn | 362/297 |
| 4,511,425 A | 4/1985 | Boyd | 156/493 |
| 4,946,547 A | 8/1990 | Palmour et al. | 156/643 |
| 5,040,868 A | 8/1991 | Waitl | |
| 5,122,943 A | 6/1992 | Pugh | 362/256 |
| 5,130,761 A | 7/1992 | Tanaka | 357/17 |
| 5,167,556 A | 12/1992 | Stein | |
| 5,200,022 A | 4/1993 | Kong et al. | 156/612 |
| 5,351,106 A | 9/1994 | Lesko et al. | 355/83 |
| RE34,861 E | 2/1995 | Davis et al. | 437/100 |
| 5,703,401 A | 12/1997 | Van De Water | |
| 5,706,177 A | 1/1998 | Nather | |
| 5,768,339 A | 6/1998 | O'Hara | 378/147 |
| 5,790,298 A | 8/1998 | Tonar | 359/267 |
| 5,813,753 A | 9/1998 | Vriens et al. | 362/293 |
| 5,907,151 A | 5/1999 | Gramann | |
| 5,912,915 A | 6/1999 | Reed et al. | 372/93 |
| 5,959,316 A | 9/1999 | Lowery | 257/98 |
| 6,061,160 A | 5/2000 | Maruyama | 359/152 |
| 6,066,861 A | 5/2000 | Hohn et al. | |
| 6,076,948 A | 6/2000 | Bukosky et al. | 362/494 |
| 6,111,276 A | 8/2000 | Mauk | 257/98 |
| 6,149,283 A | 11/2000 | Conway et al. | |
| 6,183,100 B1 | 2/2001 | Suckow et al. | 362/35 |
| 6,224,216 B1 | 5/2001 | Parker et al. | 353/31 |
| 6,259,608 B1 | 7/2001 | Berardinelli et al. | |
| 6,274,924 B1 | 8/2001 | Carey et al. | 257/676 |
| 6,296,367 B1 | 10/2001 | Parsons et al. | 362/183 |
| 6,359,236 B1 | 3/2002 | DiStefano et al. | |
| 6,376,902 B1 | 4/2002 | Arndt | 257/678 |
| 6,409,361 B1 | 6/2002 | Ikeda | 362/240 |
| 6,454,437 B1 | 9/2002 | Kelly | 362/246 |
| 6,454,439 B1 | 9/2002 | Camarota | 362/293 |
| 6,459,713 B2 | 10/2002 | Jewell | 372/46 |
| 6,469,321 B2 | 10/2002 | Arndt | |
| 6,480,389 B1 | 11/2002 | Shie et al. | 361/707 |
| 6,517,218 B2 | 2/2003 | Hochstein | 362/294 |
| 6,536,913 B1 | 3/2003 | Yajima | |
| 6,558,032 B2 | 5/2003 | Kondo et al. | 362/516 |
| 6,573,580 B2 | 6/2003 | Arndt | |
| 6,585,397 B1 | 7/2003 | Ebiko | |
| 6,603,151 B2 | 8/2003 | Lin et al. | 257/98 |
| 6,610,563 B1 | 8/2003 | Waitl | |
| 6,614,058 B2 | 9/2003 | Lin et al. | |
| 6,624,491 B2 | 9/2003 | Waitl et al. | |
| 6,680,490 B2 | 1/2004 | Yasukawa et al. | |
| 6,686,609 B1 | 2/2004 | Sung | |
| 6,707,069 B2 | 3/2004 | Song et al. | 257/79 |
| 6,710,373 B2 | 3/2004 | Wang | |
| 6,720,583 B2 | 4/2004 | Nunoue et al. | 257/98 |
| 6,758,582 B1 | 7/2004 | Hsiao et al. | 362/302 |
| 6,759,733 B2 | 7/2004 | Arndt | |
| 6,770,498 B2 | 8/2004 | Hsu | 438/26 |
| 6,774,401 B2 | 8/2004 | Nakada et al. | |
| 6,784,462 B2 | 8/2004 | Schubert | |
| 6,791,259 B1 | 9/2004 | Stokes | |
| 6,793,373 B2 | 9/2004 | Matsuba et al. | 362/260 |
| 6,797,987 B2 | 9/2004 | Chen | 257/98 |
| 6,812,502 B1 | 11/2004 | Chien et al. | 257/99 |
| 6,817,737 B2 | 11/2004 | Romano et al. | 362/293 |
| 6,840,652 B1 | 1/2005 | Hymer | 362/235 |
| 6,858,879 B2 | 2/2005 | Waitl | |
| 6,872,585 B2 | 3/2005 | Matsumura et al. | |
| 6,876,149 B2 | 4/2005 | Miyashita | |
| 6,900,511 B2 | 5/2005 | Ruhnau et al. | |
| 6,911,678 B2 | 6/2005 | Fujisawa et al. | |
| 6,914,268 B2 | 7/2005 | Shei | 257/99 |
| 6,919,586 B2 | 7/2005 | Fujii | |
| 6,940,704 B2 | 9/2005 | Stalions | |
| 6,946,714 B2 | 9/2005 | Waitl | |
| 6,975,011 B2 | 12/2005 | Arndt | |
| 6,986,594 B2 | 1/2006 | Wirth et al. | |
| 6,995,402 B2 | 2/2006 | Ludowise et al. | 257/91 |
| 6,995,405 B2 | 2/2006 | Braddell et al. | 257/99 |
| 6,995,510 B2 | 2/2006 | Murakami et al. | |
| 7,009,627 B2 | 3/2006 | Abe et al. | 345/690 |
| 7,021,797 B2 | 4/2006 | Minano et al. | 362/355 |
| 7,049,159 B2 | 5/2006 | Lowery | 438/22 |
| 7,055,991 B2 | 6/2006 | Lin | 362/311.02 |
| 7,064,907 B2 | 6/2006 | Kaneko | |
| 7,066,626 B2 | 6/2006 | Omata | |
| 7,102,213 B2 | 9/2006 | Sorg | |
| 7,119,422 B2 | 10/2006 | Chin | 257/666 |
| 7,161,189 B2 | 1/2007 | Wu | 257/98 |
| 7,213,940 B1 | 5/2007 | Van De Ven et al. | 362/231 |
| 7,221,044 B2 | 5/2007 | Fan et al. | 257/676 |
| 7,224,000 B2 | 5/2007 | Aanegola et al. | 257/98 |
| 7,275,841 B2 | 10/2007 | Kelly | 362/345 |
| 7,285,802 B2 | 10/2007 | Ouderkirk et al. | 257/98 |
| 7,321,126 B2 | 1/2008 | Singer et al. | 250/492 |
| 7,332,365 B2 | 2/2008 | Nakamura et al. | |
| 7,339,965 B2 | 3/2008 | Ledentsov et al. | 372/45 |
| D572,210 S | 7/2008 | Lee | D13/180 |
| D572,670 S | 7/2008 | Ono et al. | D13/180 |
| D576,574 S | 9/2008 | Kobayakawa | D13/180 |
| D591,697 S | 5/2009 | Andrews et al. | D13/182 |
| D593,224 S | 5/2009 | Hanley | D26/2 |
| D598,579 S | 8/2009 | Hanley | D26/1 |
| 7,573,074 B2 | 8/2009 | Shum et al. | 257/99 |
| 7,622,746 B1 | 11/2009 | Lester et al. | 257/98 |
| 7,635,915 B2 | 12/2009 | Xie et al. | 257/692 |
| 7,638,810 B2 | 12/2009 | Bour et al. | 257/98 |
| 7,722,220 B2 | 5/2010 | Van De Ven | 362/294 |
| 7,777,412 B2 | 8/2010 | Pang | 313/506 |
| 7,784,977 B2 | 8/2010 | Moolman et al. | 362/298 |
| 7,922,366 B2 | 4/2011 | Li | 362/304 |
| 8,118,451 B2 | 2/2012 | Householder et al. | 362/277 |
| 8,212,273 B2 | 7/2012 | McKenzie et al. | |
| 8,235,541 B2 | 8/2012 | Chen | 362/97 |
| 8,324,652 B1 | 12/2012 | Lester et al. | |
| 8,431,423 B2* | 4/2013 | Basin et al. | 438/26 |
| 8,492,785 B2 | 7/2013 | Hodota | 257/98 |
| 8,791,471 B2 | 7/2014 | Leung | 257/88 |
| 2002/0066905 A1 | 6/2002 | Wang | |
| 2003/0025212 A1 | 2/2003 | Bhat et al. | |
| 2003/0128733 A1 | 7/2003 | Tan et al. | 372/96 |
| 2004/0155565 A1 | 8/2004 | Holder et al. | 313/113 |
| 2004/0217362 A1 | 11/2004 | Slater et al. | |
| 2004/0217364 A1 | 11/2004 | Tarsa | |
| 2005/0135105 A1 | 6/2005 | Teixeira et al. | |
| 2005/0156187 A1 | 7/2005 | Isokawa | |
| 2005/0168994 A1 | 8/2005 | Jacobson et al. | 362/311 |
| 2005/0211993 A1 | 9/2005 | Sano et al. | 257/79 |
| 2005/0225222 A1 | 10/2005 | Mazzochette et al. | 313/46 |
| 2005/0242358 A1 | 11/2005 | Tu et al. | |
| 2006/0049411 A1 | 3/2006 | Nakamura et al. | |
| 2006/0060874 A1 | 3/2006 | Edmond et al. | 257/98 |
| 2006/0076568 A1* | 4/2006 | Keller et al. | 257/98 |
| 2006/0157723 A1 | 7/2006 | Lambkin et al. | 257/98 |
| 2006/0163586 A1 | 7/2006 | Denbaars et al. | |
| 2006/0163589 A1 | 7/2006 | Fan et al. | 257/88 |
| 2006/0278885 A1 | 12/2006 | Tain et al. | |
| 2007/0057270 A1 | 3/2007 | Bour et al. | 257/99 |
| 2007/0139923 A1 | 6/2007 | Negley | |
| 2007/0145380 A1 | 6/2007 | Shum et al. | |
| 2007/0217193 A1 | 9/2007 | Lin | |
| 2007/0217200 A1 | 9/2007 | Yang et al. | 362/277 |
| 2008/0035949 A1 | 2/2008 | Fudeta et al. | 257/99 |
| 2008/0061304 A1 | 3/2008 | Huang et al. | |
| 2008/0123341 A1 | 5/2008 | Chiu et al. | |
| 2008/0144688 A1 | 6/2008 | Chua et al. | |
| 2008/0185609 A1 | 8/2008 | Kozawa et al. | 257/99 |
| 2008/0191233 A1 | 8/2008 | Yang et al. | |
| 2008/0265268 A1* | 10/2008 | Braune et al. | 257/98 |
| 2008/0272391 A1 | 11/2008 | Kapur et al. | |
| 2008/0308825 A1 | 12/2008 | Chakraborty | |
| 2009/0026478 A1 | 1/2009 | Yoon et al. | 257/98 |
| 2009/0029495 A1 | 1/2009 | Li et al. | 438/29 |
| 2009/0050911 A1 | 2/2009 | Chakraborty | |
| 2009/0057699 A1 | 3/2009 | Basin | |
| 2009/0213591 A1 | 8/2009 | Katabe et al. | 362/236 |
| 2009/0231856 A1 | 9/2009 | Householder | |
| 2009/0283787 A1 | 11/2009 | Donofrio et al. | 257/98 |

(56) References Cited

U.S. PATENT DOCUMENTS

| | | | |
|---|---|---|---|
| 2010/0001299 A1* | 1/2010 | Chang et al. | 257/89 |
| 2010/0012962 A1 | 1/2010 | Hong et al. | |
| 2010/0029023 A1 | 2/2010 | Neff et al. | 438/15 |
| 2010/0038659 A1 | 2/2010 | Chen et al. | |
| 2010/0039822 A1 | 2/2010 | Bailey | 362/296 |
| 2010/0051995 A1 | 3/2010 | Katsuno et al. | |
| 2010/0059785 A1 | 3/2010 | Lin et al. | |
| 2010/0065881 A1 | 3/2010 | Kim | |
| 2010/0103678 A1 | 4/2010 | Van de Ven et al. | 362/294 |
| 2010/0117099 A1* | 5/2010 | Leung | 257/88 |
| 2010/0117111 A1 | 5/2010 | Illek et al. | 257/98 |
| 2010/0140635 A1 | 6/2010 | Ibbetson et al. | |
| 2010/0140648 A1* | 6/2010 | Harada et al. | 257/98 |
| 2010/0155746 A1 | 6/2010 | Ibbetson et al. | |
| 2010/0165633 A1 | 7/2010 | Moolman et al. | 362/398 |
| 2010/0171094 A1 | 7/2010 | Lu et al. | 257/13 |
| 2010/0200887 A1* | 8/2010 | Urano et al. | 257/98 |
| 2010/0279737 A1 | 11/2010 | Joppek et al. | 438/14 |
| 2010/0308354 A1 | 12/2010 | David et al. | 257/98 |
| 2010/0327295 A1 | 12/2010 | Peng et al. | 257/88 |
| 2011/0001148 A1 | 1/2011 | Sun et al. | 257/88 |
| 2011/0001422 A1 | 1/2011 | Aanegola et al. | 313/501 |
| 2011/0025190 A1 | 2/2011 | Jagt | 313/499 |
| 2011/0044027 A1 | 2/2011 | Chen | 362/97 |
| 2011/0049545 A1* | 3/2011 | Basin et al. | 257/98 |
| 2011/0075423 A1 | 3/2011 | Van De Ven | |
| 2011/0182073 A1 | 7/2011 | Sanpei et al. | 362/294 |
| 2012/0086026 A1 | 4/2012 | Engl et al. | |

FOREIGN PATENT DOCUMENTS

| | | |
|---|---|---|
| CN | 2646873 | 10/2004 |
| CN | 1581527 A | 2/2005 |
| CN | 1591924 A | 3/2005 |
| CN | 1679168 A | 10/2005 |
| CN | 1744335 A | 3/2006 |
| CN | 1801498 A | 7/2006 |
| CN | 1841183 A | 10/2006 |
| CN | 1957981 | 5/2007 |
| CN | 1977399 A | 6/2007 |
| CN | 101061590 A | 10/2007 |
| CN | 201007449 | 1/2008 |
| CN | 101360368 | 2/2009 |
| CN | 101449100 | 3/2009 |
| CN | 101460779 | 6/2009 |
| DE | WO9931737 | 6/1999 |
| DE | WO2004027882 | 4/2004 |
| DE | 102004040277 | 2/2006 |
| DE | 102007003282 | 7/2008 |
| DE | 102008005497 | 7/2009 |
| DE | 102008035900 | 11/2009 |
| EP | 1005085 A2 | 5/2000 |
| EP | 1187226 A1 | 3/2002 |
| EP | 1187227 | 3/2002 |
| EP | 1187228 | 3/2002 |
| EP | 1 418 630 A1 | 5/2004 |
| EP | 1521313 | 4/2005 |
| EP | 1 538 680 A2 | 6/2005 |
| EP | 1750310 A2 | 2/2007 |
| EP | 1 953 834 A1 | 8/2008 |
| EP | 2259345 A1 | 12/2010 |
| EP | 2369650 A2 | 9/2011 |
| GB | 2420221 A | 12/2004 |
| GB | 2420221 A | 5/2006 |
| GB | 2 458 972 A | 10/2009 |
| JP | 53-118019 | 10/1978 |
| JP | 59-27559 A | 2/1984 |
| JP | 61-48951 A | 3/1986 |
| JP | 03-171780 | 7/1991 |
| JP | 06045649 | 2/1994 |
| JP | 06-177424 | 6/1994 |
| JP | 06268252 | 9/1994 |
| JP | 7-202271 A | 8/1995 |
| JP | 8139257 | 5/1996 |
| JP | 11008405 | 1/1999 |
| JP | 11-054802 | 2/1999 |
| JP | 11150306 | 6/1999 |
| JP | 11167805 A | 6/1999 |
| JP | 11261113 | 9/1999 |
| JP | 2000-188358 | 7/2000 |
| JP | 2000-223751 | 8/2000 |
| JP | 2000223752 | 8/2000 |
| JP | 2001044506 | 2/2001 |
| JP | 200160072 | 3/2001 |
| JP | 2001-168400 | 6/2001 |
| JP | 2001518692 | 10/2001 |
| JP | 2002-223005 | 8/2002 |
| JP | 2003-197974 | 7/2003 |
| JP | 2003-264267 | 9/2003 |
| JP | 2004-111937 A | 4/2004 |
| JP | 2004-200236 | 7/2004 |
| JP | 2005-19838 A | 1/2005 |
| JP | 2005-079167 | 3/2005 |
| JP | 2005150624 | 6/2005 |
| JP | 2005197289 | 7/2005 |
| JP | 2005-310935 | 11/2005 |
| JP | 2006-119357 | 5/2006 |
| JP | 2006-324331 | 11/2006 |
| JP | 2007-094088 | 4/2007 |
| JP | 2007-165029 | 6/2007 |
| JP | 2007-273763 | 10/2007 |
| JP | 2007-287981 | 11/2007 |
| JP | 2007-299905 | 11/2007 |
| WO | WO 00/34709 A1 | 6/2000 |
| WO | WO0217405 | 2/2002 |
| WO | WO2004044877 | 5/2004 |
| WO | WO 2004/053933 A2 | 6/2004 |
| WO | WO2005043627 A1 | 5/2005 |
| WO | WO 2005/066539 A1 | 7/2005 |
| WO | WO 2005/078338 A1 | 8/2005 |
| WO | WO2005104247 | 11/2005 |
| WO | WO2005117152 | 12/2005 |
| WO | WO2006054228 A2 | 5/2006 |
| WO | WO2006054228 A3 | 5/2006 |
| WO | WO2006054228 A3 | 5/2006 |
| WO | WO 2006/092697 A1 | 9/2006 |
| WO | WO2007121739 | 1/2007 |
| WO | WO 2007/083408 A1 | 7/2007 |
| WO | WO2007115040 | 10/2007 |
| WO | WO2007/127029 A2 | 11/2007 |
| WO | WO 2007/130536 A2 | 11/2007 |
| WO | 2008089324 A2 | 7/2008 |
| WO | 2008089324 A3 | 7/2008 |
| WO | WO2008107654 | 9/2008 |
| WO | WO2008149250 | 12/2008 |
| WO | WO 2009/056927 A1 | 5/2009 |
| WO | WO 2009/074919 A1 | 6/2009 |
| WO | WO 2010/029475 A1 | 3/2010 |
| WO | WO2010029475 | 3/2010 |
| WO | 2010151600 | 12/2010 |
| WO | 2011031098 A2 | 3/2011 |
| WO | WO2011071100 A1 | 6/2011 |

OTHER PUBLICATIONS

Extended Supplementary European Search Report for EP Application No. EP 07789665.2 dated Nov. 7, 2011.
Second Office Action for Chinese Patent Application No. CN200880009255.7 mailed Oct. 13, 2011.
International Search Report and Written Opinion for PCT Application No. PCT/US2011/001457 mailed Dec. 13, 2011.
Office Action from related China Application No. 200710142310.7, dated: Dec. 11, 2009.
U.S. Publication No. US 2006/0102917 A1, dated: May 18, 2006, to Oyama et al.
U.S. Publication No. US 2003/0116769 A1, dated; Jun. 26, 2003 to Song at al.
Declaration of Gerald Negley under 37 C.F.R.§ 1.132, dated: Aug. 20, 2009.
Declaration of Charles Swoboda under 37 C.F.R.§ 1.132, dated: Aug. 19, 2009.
Abstracts of Japan JP 2007-273763, dated: Oct. 18, 2007, Sony Corp.

(56) References Cited

OTHER PUBLICATIONS

Abstracts of Japan JP 2006-324331, dated: Nov. 30, 2006, Sony Corp.
Abstracts of Japan JP 2007-299905, dated: Nov. 15, 2007, Nichia Chem.
Abstracts of Japan JP 2007-287981, dated: Nov. 1, 2007, Konica Minolta Opto.
Appeal Decision in Japanese Design Patent Application No. 2009-002857 (Appeal No. 2010-002154) mailed Aug. 20, 2010.
US Publication No. 2004/0227149 A1, Pub. Date Nov. 2004, Ibbetson.
US Publication No. 2005/0072981 A1, Pub. Date: Apr. 2005, Suenaga.
US Publication No. 2006/0108594 A1, Pub. Date: May 2006, Iwasaki et al.
US Publication No. 2004/0047151, Pub. Date: Mar. 2004, Bogner et al.
US Publication No. 2004//0041222, Pub. Date: Mar. 2004, Loh.
US Publication No. 2005/0179376, Pub. Date: Aug. 2005, Fung et al.
Office Action from U.S. Appl. No. 12/321,059, dated: May 17, 2010.
Response to Office Action from U.S. Appl. No. 12/321,059 dated: May 17, 2010.
Office Action from U.S. Appl. No. 12/321,059, dated: Sep. 24, 2010.
Response to Office Action from U.S. Appl. No. 12/321,059 dated: Nov. 23, 2010.
Response to Office Action from U.S. Appl. No. 12/321,059 dated: Dec. 22, 2010.
Office Action from U.S. Appl. No. 12/154,691, dated: Dec. 17, 2009.
Response to Office Action from U.S. Appl. No. 12/154,691, dated: May 17, 2009.
Notice of Allowance for U.S. Appl. No. 12/154,691, dated: Jun. 17, 2010.
Office Action from U.S. Appl. No. 11/465,120, dated: Aug. 21, 2008.
Response to Office Action from U.S. Appl. No. 11/465,120, dated: Nov. 21, 2008.
Office Action from U.S. Appl. No. 11/465,120, dated: Feb. 20, 2009.
Response to Office Action from U.S. Appl. No. 11/465,120, dated: Apr. 20, 2009.
Office Action from U.S. Appl. No. 11/465,120, dated: May 4, 2009.
Response to Office Action from U.S. Appl. No. 11/465,120, dated: Jun. 22, 2009.
Office Action from U.S. Appl. No. 11/465,120, dated: Jul. 21, 2009.
Response to Office Action from U.S. Appl. No. 11/465,120, dated: Oct. 21, 2009.
Response to Office Action from U.S. Appl. No. 11/465,120, dated: Dec. 1, 2009.
Office Action from U.S. Appl. No. 11/465,120, dated: Mar. 9, 2010.
Response to Office Action from U.S. Appl. No. 11/465,120, dated: Jun. 9, 2010.
Office Action from U.S. Appl. No. 11/465,120, dated: Sep. 8, 2010.
Response to Office Action from U.S. Appl. No. 11/465,120, dated: Nov. 8, 2010.
Office Action from U.S. Appl. No. 11/465,120, dated: Nov. 16, 2010.
Response to Office Action from U.S. Appl. No. 11/465,120, dated: Dec. 1, 2010.
Office Action from U.S. Appl. No. 11/465,120, dated: Dec. 13, 2010.
Office Action from U.S. Appl. No. 11/149,998, dated: Jan. 8, 2007.
Response to Office Action from U.S. Appl. No. 11/149,998, dated: Jun. 8, 2007.
Office Action from U.S. Appl. No. 11/149,998, dated: Aug. 17, 2007.
Response to Office Action from U.S. Appl. No. 11/149,998, dated: Dec. 17, 2007.
Office Action from U.S. Appl. No. 11/149,998, dated: Feb. 5, 2008.
Response to Office Action from U.S. Appl. No. 11/149,998, dated: May 5, 2008.
Office Action from U.S. Appl. No. 11/149,998, dated: Jul. 21, 2008.
Response to Office Action from U.S. Appl. No. 11/149,998, dated: Oct. 21, 2008.
Office Action from U.S. Appl. No. 11/149,998, dated: Jan. 5, 2009.
Response to Office Action from U.S. Appl. No. 11/149,998, dated: Apr. 3, 2009.
Office Action from U.S. Appl. No. 11/149,998, dated: Jul. 14, 2009.
Response to Office Action from U.S. Appl. No. 11/149,998, dated: Oct. 14, 2009.
Office Action from U.S. Appl. No. 11/149,998, dated: Nov. 20, 2009.
Response to Office Action from U.S. Appl. No. 11/149,998, dated: Feb. 22, 2010.
Office Action from U.S. Appl. No. 11/149,998, dated: May 18, 2010.
Response to Office Action from U.S. Appl. No. 11/149,998, dated: Aug. 2, 2010.
Office Action from U.S. Appl. No. 11/149,998, dated; Aug. 27, 2010.
Response to Office Action from U.S. Appl. No. 11/149,998, dated: Nov. 19, 2010.
Office Action from U.S. Appl. No. 12/069,827, dated: Apr. 20, 2010.
Response to Office Action from U.S. Appl. No. 12/069,827, dated: Sep. 20, 2010.
Office Action from U.S. Appl. No. 12/069,827, dated: Oct. 29, 2010.
Office Action from U.S. Appl. No. 29/293,900, dated: Apr. 5, 2010.
Office Action from U.S. Appl. No. 29/293,900, dated: Sep. 24, 2010.
Notice of Allowance from U.S. Appl. No. 29/293,900, dated: Jul. 21, 2010.
Office Action from U.S. Appl. No. 12/152,766, dated: Mar. 12, 2010.
Response to Office Action from U.S. Appl. No. 12/152,766, dated: Sep. 13, 2010.
Office Action from U.S. Appl. No. 12/152,766, dated: Oct. 7, 2010.
US Publication No. 2002/0171911, Pub. Date: Nov. 2002, Maegawa.
US Publication No. 2003/0183852, Pub. Date: Oct. 2003, Takenaka.
US Publication No. 2005/0152127, Pub. Date: Jul. 2005.
US Publication No. 2005/0077535, Pub. Date: Apr. 2005.
US Publication No. 2006/0220046, Pub. Date: Oct. 2006.
US Publication No. 2008/0074032, Pub. Date: Mar. 2008.
US Publication No. US 2005/0135105 A1, Date: Jun. 2005, to Teixeria et al.
US Publication No. US 2006/0133044 A1, Date: Jun. 2006, to Kim at al.
US Publication No. US 2008/0013319 A1, Date: Jan. 2008, to Pei et al.
US Publication No. US 2008/0191232 A1, Date: Aug. 2008, to Lee et al.
US Publication No. US 2008/0303052 A1, Date: Dec. 2008, to Lee et al.
US Publication No. US 2009/0189178 A1, Date: Jul. 2009, to Kim at al.
Nichia Corp. White LED Part No. NSPW300BS, Specification for Nichia White LED , Model NSPW300BS., Jan. 14, 2004.
Nicha Corp., White LED Part No. NSPW312BS, Specification for Nichia White LED, Model NSPW312BS. Jan. 14, 2004.
Kim J.K et al. "Strongly Enhanced Phosphor Efficiency in GaInN White Light-Emitting Diodes Using Remote Phosphor Configuration and Diffuse Reflector Cup" Japanese Journal of Applied Physics, Japan Society of Applied Physics, Tokyo, JP, vol. 44, No. 20-23, Jan. 1, 2005 XP-001236966, pp. 649-651.
US Publication No. US 2009/0129085 A1, Date: May 2009, to Aizar et al.
US Publication No. US 2009/0050908 A1, Date: Feb. 2009, to Yuan at al.
US Publication No. US 2008/0186702 A1, Date: Aug. 2008, to Camras et al.
US Publication No. US 2007/0046176 A1, Date: Mar. 2007, to Bukesov at al.
US Publication No. US 2004/0041222 A1, Date: Mar. 2004, to Loh, Ban P.
US Publication No. US 2007/0109779 A1, Date: May 2007, to Sekiguchi at al.
US Publication No. US 2009/0072251 A1, Date: Mar. 2009, to Chan at al.
US Publication No. US 2009/0283781 A1, Date: Nov. 2009, to Chan et al.
US Publication No. US 2004/0079957, Date: Apr. 29, 2004, to Andrews et al.
US Publication No. US 2004/0080939 A1, Date: Apr. 29, 2004, to Braddell et al.

(56) References Cited

OTHER PUBLICATIONS

US Publication No. US 2004/0126913 A1, Date: Jul. 1, 2004, to Loh.
US Publication No. 2002/0061174 A1, Pub. Date: May 2002 Hurt et al.
US Publication No. 2002/0123163, Pub. Date: Sep. 2002 Fujii.
US Publication No. 2002/0163001, Pub. Date: Nov. 2002 Shaddock.
US Publication No. 2002/0195935, Pub. Date: Dec. 2002 Jager.
US Publication No. 2004/0232435, Pub. Date: Nov. 2004 Hofer.
US Publication No. 2004/0238930, Pub. Date: Dec. 2004 Arndt.
US Publication No. 2005/0023548, Pub. Date: Feb. 2005, Brat.
US Publication No. 2005/0093005, Pub. Date: May 2005, Ruhnau.
US Publication No. 2005/0127377, Pub. Date: Jun. 2005, Arndt.
US Publication No. 2006/0157828, Pub. Date: Jul. 2006, Sorg.
US Publication No. 2006/0022212, Pub. Date: Feb. 2006, Waitl.
JP 2001 060072A, Abstract, Matsushita Electric Ind. Co Ltd., Mar. 6, 222001.
First Office Action for Chinese Patent Application No. 200780019643.9, dated: Mar. 29, 2010.
International Search Report for PCT/CN2009/074800, mailed Feb. 25, 2010.
US Publication No. 2009/0129085 A1, date: May 2009, to Aizar.
US Publication No. 2005/0135105 A1, Date: Jun. 2005, to Teixerira at al.
US Publication No. 2008/0013319 A1, Date: Jan. 2008, to Pei et al.
US Publication No. 2008/0191232 A1, Date: Aug. 2008, to Lee et al.
US Publication No. 2007/0170449 A1, Date: Jul. 2007, to Anandan.
US Publication No. 2008/0303052 A1, Date: Dec. 2008, to Lee et al.
US Publication No. 2009/0189178 A1, Date: Jul. 2009, to Kim et al.
US Publication No. 2004/0041222 A1, Date: Mar. 2004, to Loh.
US Publication No. 2007/0109779 A1, Date: May 2007, to Sekiguchi.
US Publication No. 2009/0072251 A1, Date: Mar. 2009, to Chan et al.
US Publication No. 2009/0283781 A1, Date: Nov. 2009, to Chan et al.
US Publication No. 2009/0050908 A1, Date: Feb. 2009, to Yuan et al.
US Publication No. 2008/0186702 A1, Date: Aug. 2008, to Camras et al.
US Publication No. 2007/0046176 A1, Date: Mar. 2007, to Bukesov et al.
Preliminary Notice of Reasons for Refusal re related Japanese Application No. 2009-002857, dated: Jul. 24, 2009.
U.S. Appl. No. 11/473,089, filed Jun. 21, 2006, "Electronic Deposition of Semiconductor Devices".
Official Notice of Decision for Refusal regarding related Japanese Design Application No. 2009-002857, dated Oct. 30, 2009.
US Publication No. US 2007/0262339 A1, Date: Nov. 15, 2007 to Hussell at al.
U.S. Appl. No. 11/656,759, filed Jan. 22, 2007, to Chitnis et al. "Wafer Level Phosphor Coating Method and Devices Fabricated Utilizing Method".
U.S. Appl. No. 11/899,790, filed Sep. 7, 2007, to Chitnis at al. "Wafer Level Phosphor Coating Method and Devices Fabricated Utilizing Method".
Cree XLamp® XR-E LEDS data page, retrieved at http://www.cree.com/products/xlamp7090 xre.asp on Sep. 15, 2010, pp. 1-3.
Cree XLamp® XR-C LEDs data page, retrieved at http://www.cree.com/products/xlamp_xrc.asp on Sep. 15, 2010, pp. 1-3.
Cree XLamp® XP-E LED data page, retrieved at http://www.cree.com/products/xlamp_xpg.asp on Sep. 15, 2010, pp. 1-4.
Cree XLamp® XP-G LED data page retrieved at http://www.cree.com/products/xlamp_xpg.asp on Sep. 15, 2010, pp. 1-3.
Cree XLamp® MC-E LED data page retrieved at http://www.cree.com/products/xlamp_mce.asp on Sep. 15, 2010, pp. 1-3.
US Publication No. 2005/5117320, Pub. Date: Jun. 2005.
US Publication No. 2007/0269586 A1, Pub. Date: Nov. 2007, Leatherdale.
US Publication No. 2006/0049477 A1, Pub. Date: Mar. 2006 Arndt.
US Publication No. 2002/0021085, Pub. Date: Feb. 2002, to Ng, Kee Yean.
US Publication No. 2007/0170449 A1, Pub. Date: Jul. 2007, to Anandian, Munisamy.
US Publication No. 2008/0121921 A1, Pub. Date: May 2008, to Loh et al.
International Search Report and Written Opinion for PCT Application No. PCT/US2010/002827 mailed May 2, 2011.
Cree® XLamp® MC-E LEDS Product Info Sheets, pp. 1-3.
Notice of Reasons for Rejection for Japanese Patent Application No. 2007-211901 dated Apr. 14, 2011.
International Preliminary Report on Patentability for PCT/CN2010/070073 mailed Apr. 28, 2011.
International Search Report and Written Opinion for PCT/CN2010/001865 mailed Jun. 9, 2011.
Office Action in related U.S. Appl. No. 12/002,410, dated: Apr. 26, 2011.
Office Action in related U.S. Appl. No. 12/002,410, dated: May 25, 2010.
Office Action in related U.S. Appl. No. 12/002,410, dated: Dec. 13, 2010.
Office Action in related U.S. Appl. No. 11/149,998, dated: May 11, 2011.
Office Action in related U.S. Appl. No. 11/149,998, dated: Aug. 27, 2010.
Office Action in related U.S. Appl. No. 11/149,998, dated: Jan. 24, 2011.
Office Action in related Patent Appl. No. 11/149,998, dated: Nov. 20, 2009.
Response to OA in related U.S. Appl. No. 11/149,998, dated: Nov. 20, 2009, Response filed: Feb. 22, 2010.
Office Action in related U.S. Appl. No. 11/149,998, dated: May 18, 2010.
Office Action in related U.S. Appl. No. 12/291,293, dated: May 27, 2010.
Office Action in related U.S. Appl. No. 12/291,293, dated: Sep. 3, 2010.
Office Action in related U.S. Appl. No. 12/291,293, dated: Mar. 1, 2011.
Office Action in related U.S. Appl. No. 11/496,922, dated: Jun. 10, 2010.
Office Action in related U.S. Appl. No. 11/496,922, dated: Dec. 15, 2010.
Office Action in related U.S. Appl. No. 12/152,766, dated: Oct. 7, 2010.
Office Action in related U.S. Appl. No. 12/152,766, dated: Apr. 1, 2011.
Office Action in related U.S. Appl. No. 12/152,766, dated: Mar. 12, 2010.
Office Action in related U.S. Appl. No. 11/465,120, dated: Sep. 8, 2010.
Office Action in related U.S. Appl. No. 11/465,120, dated: Dec. 13, 2010.
Office Action in related U.S. Appl. No. 11/465,120, dated: Mar. 9, 2010.
Office Action in related U.S. Appl. No. 12/635,818, dated: Oct. 14, 2010.
Office Action in related U.S. Appl. No. 12/695,978, dated: Dec. 20, 2010.
Office Action in related U.S. Appl. No. 12/695,978, dated: May 10, 2011.
Office Action in related U.S. Appl. No. 12/069,827, dated: Oct. 29, 2010.
Office Action in related U.S. Appl. No. 12/069,827, dated: Apr. 20, 2010.
Office Action in related U.S. Appl. No. 12/069,827, dated: Jan. 27, 2011.
Office Action in related U.S. Appl. No. 12/154,691, dated: Dec. 17, 2009.
Response to OA in related U.S. Appl. No. 12/154,691, dated: Dec. 17, 2009, Response filed: May 17, 2010.
Office Action in related U.S. Appl. No. 12/321,059, dated: May 17, 2010.
Nichia Corp. White LED Part No. NSPW300BS, Specification for Nichia White LED Model NSPW300BS Jan. 14, 2004.

(56) References Cited

OTHER PUBLICATIONS

Nichia Corp. White LED Part No. NSPW312BS, Specification for Nichia White LED Model NSPW312BS Jan. 14, 2004.
U.S. Appl. No. 11/656,759, filed Jan. 22, 2007, Wafer Level Phosphor Coating Method and Devices Utilizing Method.
U.S. Appl. No. 11/899,790, filed Sep. 7, 2007, Wafer Level Phosphor Coating Method and Devices Utilizing Method.
U.S. Appl. No. 11/473,089, filed Jun. 21, 2006, Close Loop Electrophoretic Deposition of Semiconductor Devices.
Notice of Reasons for Rejection for Japanese Patent Application No. JP 2008-515699 dated May 19, 2011.
Notice of Reasons for Rejection for Japanese Patent Application No. JP 2009-507195 dated Jun. 10, 2011.
Notice of Reasons for Rejection for Japanese Patent Application No. JP 2008-281533 dated Jun. 24, 2011.
Office Action from U.S. Appl. No. 12/291,293, dated: Jul. 19, 2011.
Response to Office Action from U.S. Appl. No. 12/291,293, OA dated: Jul. 19, 2011, Resp. dated: Oct. 19, 2011.
Office Action from U.S. Appl. No. 11/465,120, dated: Jun. 14, 2011.
Office Action from U.S. Appl. No. 12/069,827, dated: Jun. 16, 2011.
Response to Office Action from U.S. Appl. No. 12/069,827, OA dated: Jul. 16, 2011, Resp. dated: Aug. 3, 2011.
Office Action from U.S. Appl. No. 12/321,059, dated: Jun. 22, 2011.
Response to Office Action from U.S. Appl. No. 12/321,059, OA dated: Jun. 22, 2011, Resp. dated: Aug. 22, 2011.
Office Action from U.S. Appl. No. 12/321,059, dated: Aug. 26, 2011.
Response to Office Action from U.S. Appl. No. 12/321,059, OA dated: Jun. 22, 2011, Resp. dated: Sep. 20, 2011.
Office Action from U.S. Appl. No. 11/496,922, dated: Jul. 5, 2011.
Office Action from U.S. Appl. No. 12/695,978, dated: Sep. 14, 2011.
Office Action from U.S. Appl. No. 11/149,998, dated: Sep. 21, 2011.
Office Action from U.S. Appl. No. 12/321,059, dated: Oct. 4, 2011.
Office Action from U.S. Appl. No. 12/069,827, dated: Oct. 26, 2011.
Notification of First Office Action in application CN 200880009255.7 mailed Sep. 26, 2010.
International Search Report and Written Opinion from PCT/CN2010/001009 mailed Oct. 21, 2010.
International Search Report and Written Opinion from PCT/US2010/001852 mailed Nov. 11, 2010.
Office Action from U.S. Appl. No. 12/418,796, Dated: Jul. 20, 2011.
Office Action from U.S. Appl. No. 12/329,722, Dated: Oct. 27, 2010.
Notification of the First Office Action from Chinese Patent Application No. 201010167346.2. dated Feb. 29, 2012.
Decision of Rejection for Japanese Patent Application No. 2007-211901, dated: Jan. 30, 2012.
International Search Report and Written Opinion for PCT Application No. PCT/US2011/001394 mailed Nov. 3, 2011.
DOM LED Downlighting, Lithonia Lighting: an Acuity Brands. Company, www.lithonia.com. © 2009.
Ecos, Lighting the Next Generation, gothan: a division of Acuity Brands Lighting Inc. . © 2008.
Renaissance Lighting brochure. © 2010.
International Preliminary Report on Patentability from Application No. PCT/US09/66938. dated Apr. 3, 2012.
"High-Performance GaN-Based Vertical-Injection Light-Emitting Diodes With TiO2-SiO2 Omnidirectional Reflector and n-GaN Roughness" by H. W. Huang, et al. , IEEE Photonics Technology Letters. vol. 19. No. 8, Apr. 15, 2007. pp. 565-567.
Notice of Reasons for Rejection from Japanese Patent Application No. 2009-507195. dated May 8, 2012.
First Office Action for Chinese Patent Application No. 200980153995.2 . dated May 4, 2012.
First Office Action for Chinese Patent Application No. 200910145412.3, dated Apr. 28, 2012.
Office Action from U.S. Appl. No. 11/465,120, mailed Dec. 9, 2011.
US Publication No. 2004/0256706, dated: Dec. 2004 to Nakashima, Shintaro.
Office Action from U.S. Appl. No. 12/002,410, mailed Mar. 28, 2012.
Office Action from U.S. Appl. No. 12/002,410, mailed Dec. 21, 2011.
US Publication No. 2008/0296590, dated: Dec. 2008, to Ng, Kee Yean.
Response to Office Action for U.S. Appl. No. 12/002,410, filed Mar. 8, 2012.
Office Action from U.S. Appl. No. 11/496,922, mailed Feb. 9, 2012.
Response to Office Action for U.S. Appl. No. 11/496,922, filed Apr. 6, 2012.
Advisory Action for U.S. Appl. No. 11/496,922, mailed Apr. 18, 2012.
Office Action from U.S. Appl. No. 12/321,059, mailed Feb. 10, 2012.
Response to Office Action for U.S. Appl. No. 12/321,059, filed Apr. 9, 2012.
Advisory Action from U.S. Appl. No. 12/321,059, mailed Apr. 20, 2012.
Office Action from U.S. Appl. No. 12/695,978, mailed Mar. 14, 2012.
Office Action from U.S. Appl. No. 11/982,275, mailed Mar. 23, 2012.
US Publication No. 2002/0030194 A1, dated: Mar. 2002, to Camras et al.
US Publication No. 2005/0179041 A1, dated: Aug. 2005, to Harbers et al.
Office Action from U.S. Appl. No. 12/614,989, mailed Mar. 12, 2012.
Office Action from U.S. Appl. 12/069,827, mailed Apr. 3, 2012.
First Office Action for Chinese Patent Application No. 201110039138.9, dated Jun. 4, 2012.
Decision of Rejection from Japanese Patent Application No. 2008-515699, dated Jul. 17, 2012.
International Search Report and Written Opinion for Application No. PCT/US2012/034564, dated Sep. 5, 2012.
International Search Report and Written Opinion from PCT Application No. PCT/US2013/028684, dated May 28, 2013.
Jong Kyu kim, et al., "GaInN Light-emitting Diodes with RuO2/SiO2/Ag Omni-directional Reflector", Applied Physics Letters, AIP, American Institute of Physics, Nelville, NY, US, vol. 84, No. 22, May 31, 2004, pp. 4508-4510, XP012061652.
Y.S. Zhao, at al., "Efficiency Enhancement of InGaN/GaN Light-Emitting Diodes with a Back-Surface distributed Bragg Reflector", Journal of Electronic Materials, vol. 32, No. 12. Dec. 1, 2003. pp. 1523-1526, XP055063308.
Xu Qing-tao, et al., "Enhancing Extraction Efficiency from GaN-based LED by Using an Omni-directional Reflector and Photonic Crystal", Optoelectronics Letters, vol. 5, No. 6, Nov. 1, 2009, pp. 405-408. XP055063309.
J.-Q Xi, et al., "Optical Thin-film Materials with Low Refractive Index for Broadband Elimination of Fresnel Reflection". Nature Photonics. Nature Publishing Group. UK. vol. 1, No. 3, Mar. 1, 2007, pp. 176-179, XP002590687.
Notice of Reasons for Rejection from Japanese Patent Appl. No. 2011-539526, dated Jun. 25, 2013.
First Office Action and Search Report from Chinese Patent Appl. No. 201080023107.8, dated Jul. 12, 2013.
First Office Action from Chinese Patent Appl. No. 201180047069.4, dated Dec. 18, 2013.
Office Action from U.S. Appl. No. 12/855,500, dated Dec. 4, 2013.
Office Action from U.S. Appl. No. 12/855,500, dated May 31, 2013.
Response to OA from U.S. Appl. No. 12/855,500, filed Sep. 3, 2013.
Office Action from U.S. Appl. No. 13/071,349, dated May 28, 2013.
Response to OA from U.S. Appl. No. 13/071,349, filed Jul. 18, 2013.
Office Action from U.S. Appl. No, 13/071,349, dated Jan. 17, 2013.
Response to OA from U.S. Appl. No. 13/071,349, filed Apr. 10, 2013.
Office Action from U.S. Appl. No. 12/553,025, dated Jun. 19, 2013.
Huang at al. High-Performance GaN-Based Vertical-Injection Light-Emitting Diodes with TiO2-Sio2 Ohnidirectional Reflector and n-GaN Roughness. IEEE Photonics Technology Letters, vol. 19. No. 8, Apr. 15, 2007, pp. 565-567.
Raoufi et al. Surface characterization and microstructure of ITO thin films at different annealing temperatures. Applied Surface Science 253 (2007), pp. 9085-9090.
Office Action from U.S. Appl. No. 13/168,689, dated Jun. 28, 2013.
Office Action from U.S. Appl. No. 12/606,377, dated Jul. 9, 2013.
Office Action from U.S. Appl. No. 12/418,796, dated Aug. 7, 2012.
Response to OA from U.S. Appl. No. 12/418,796, filed Nov. 7, 2012.
Office Action from U.S. Appl. No. 12/418,796, dated Feb. 22, 2012.
Response to OA from U.S. Appl. No. 12/418,796, filed Jun. 22, 2012.

(56) References Cited

OTHER PUBLICATIONS

Office Action from U.S. Appl. No. 13/415,626. dated Sep. 28, 2012.
Response to OA from U.S. Appl. No. 13/415,626, filed Jan. 23, 2013.
Office Action from U.S. Appl. No. 12/855,500. dated Oct. 1, 2012.
Response to OA from U.S. Appl. No. 12/855,500, filed Feb. 25, 2013.
Office Action from U.S. Appl. No. 12/606,377, dated Nov. 26, 2012.
Response to OA from U.S. Appl. No. 12/606,377, filed Feb. 22, 2013.
Office Action from U.S. Appl. No. 13/415,626, dated Feb. 28, 2013.
Response to OA from U.S. Appl. No. 13/415,626, filed Apr. 17, 2013.
Decision of Patent Grant from Japanese Patent Appl. No. 2011-539526. dated Oct. 22, 2013.
First Office Action from Japanese Patent Appl. No. 201180047069.4. dated: Dec. 18, 2013.
Search Report from Japanese Patent Appl. No. 201180047069.4. dated: Dec. 18, 2013.
Comments on the Written Opinion and Amendment of the Application from European Patent Appl. No. 12723543.0, dated Feb. 21, 2014.
Final Office Action from U.S. Appl. No. 12/553,025, dated Dec. 31, 2013.
Lin. et al., "Enhancement of InGaN-GaN Indium-Tin-Oxide Flip-Chip Light-Emitting Diodes with TiO2-SiO2 Multilayer Stack Omnidirectional Reflector". IEEE Photonics Technology Letters. vol. 18, No. 19, Oct. 1, 2006.
Second OA from Chinese Patent Appl. No. 201080023107.8, dated Mar. 7, 2014.
Office Action from U.S. Appl. No. 13/909,927, dated Apr. 2, 2014.
Office Action from U.S. Appl. No. 12/606,377, dated Apr. 9, 2014.
Third Office Action from Chinese Appl. No. 201080023107.8, dated Sep. 29, 2014.
Communication from European Appl. No. 13709035.3-1551, dated Oct. 15, 2014.
Office Action from U.S. Appl. No. 12/606,377, dated Sep. 3, 2014.
Response to OA from U.S. Appl. No. 12/606,377, filed Oct. 23, 2014.
Office Action from U.S. Appl. No. 13/370,696, dated Aug. 27, 2014.
Examination Report from European Patent Appl. No. 10774320.5-1757. dated Sep. 5, 2014.
Second Office Action from Chinese Patent Appl. No. 2011800470694, dated Aug. 6, 2014.
International Preliminary Report on Patentability from Appl. No. PCT/US2013/028684, dated Sep. 18, 2014.
First Office Action and Search Report from Chinese Patent Appl. No. 2009-801492053, dated Jun. 20, 2014.
Office Action from U.S. Appl. No. 13/909,927, dated Aug. 8, 2014.
First Office Action from Chinese Patent Application No. 2009-801492034, dated Jun. 24, 2014.
European Examination Report from European Patent Appl. No. 10 725 524.2-1757, dated Nov. 3, 2014.
International Search Report and Written Opinion from PCT/US2014/058896, dated Dec. 22, 2014.
Office Action from U.S. Appl. No. 13/028,946, dated Oct. 28, 2014.
Response to OA from U.S. Appl. No. 13./028,946, filed Dec. 15, 2014.
Office Action from U.S. Appl. No. 14/219,916, dated Oct. 29, 2014.
Office Action from U.S. Appl. No. 13/909,927, dated Nov. 6, 2014.
Second Office Action from Chinese Patent Appl. No. 2009801492034, dated Jan, 6, 2015.
Examiner's Report from European Patent Appl. No. 10 774 320.5-1757, dated Feb. 10. 2015.

\* cited by examiner

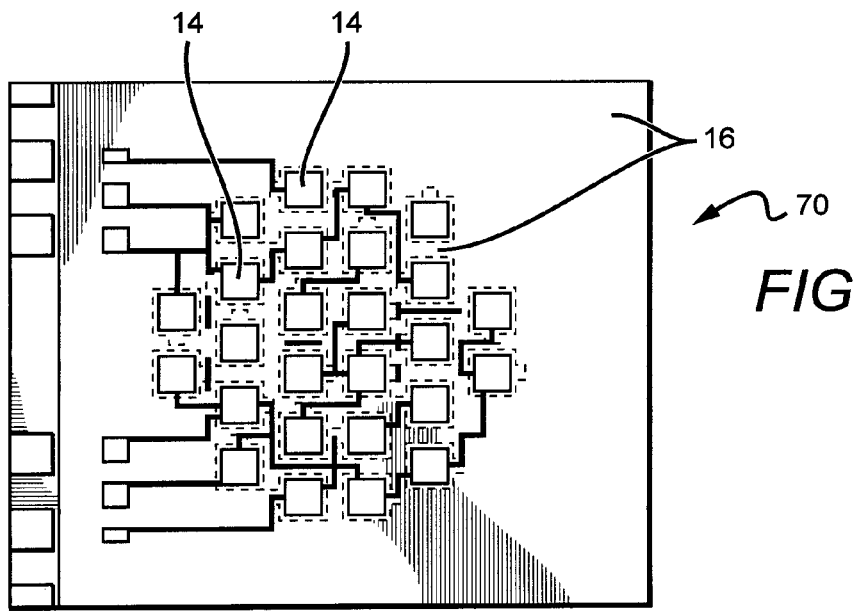
FIG. 8
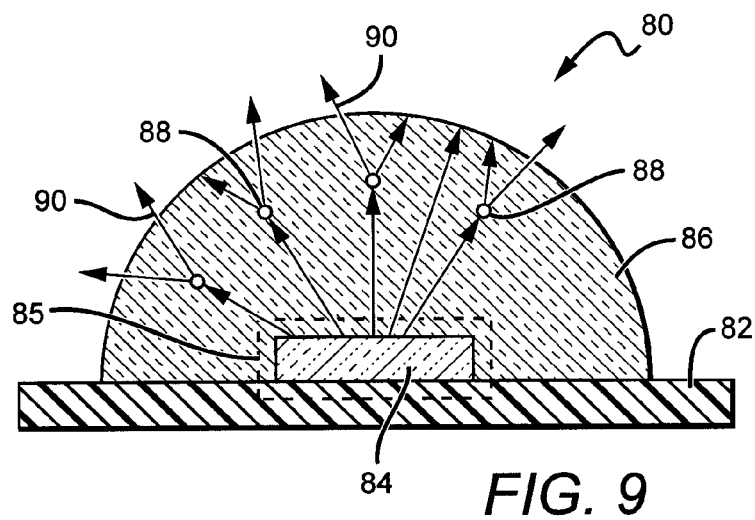
FIG. 9
FIG. 10
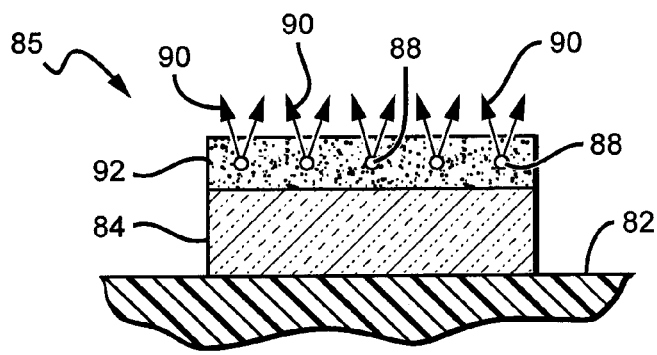

HIGH REFLECTIVE SUBSTRATE OF LIGHT EMITTING DEVICES WITH IMPROVED LIGHT OUTPUT

BACKGROUND OF THE INVENTION

1. Field of the Invention

The present invention relates generally to light emitting devices, and more particularly to light emitting devices with highly reflective properties for improved light output.

2. Description of the Related Art

Light emitting diodes (LED or LEDs) are solid state devices that convert electric energy to light and generally comprise an active region of semiconductor material sandwiched between two oppositely doped layers of semiconductor material. When a bias is applied across the doped layers, holes and electrons are injected into the active region where they recombine to generate light. Light is emitted from the active layer and from all surfaces of the LED.

LEDs can be fabricated to emit light in various colors. However, conventional LEDs cannot generate white light from their active layers. Light from a blue emitting LED has been converted to white light by surrounding the LED with a yellow phosphor, polymer or dye, with a typical phosphor being cerium-doped yttrium aluminum garnet (Ce:YAG). The surrounding phosphor material "downconverts" the energy of some of the LED's blue light which increases the wavelength of the light, changing its color to yellow. Some of the blue light passes through the phosphor without being changed while a portion of the light is downconverted to yellow. The LED emits both blue and yellow light, which combine to provide a white light. In another approach light from a violet or ultraviolet emitting LED has been converted to white light by surrounding the LED with multicolor phosphors or dyes.

In recent years, there have been dramatic improvements in light emitting diode technology such that LEDs of increased brightness and color fidelity have been introduced. Due to these improved LEDs, lighting modules have become available to further increase luminous flux output. Both single and multi-chip modules have become available, with a single-chip module generally comprising a single package with a single LED. Multi-chip lighting modules typically comprise a single package with a plurality of LEDs. These lighting modules, particularly the multi-chip modules, generally allow for high output of light emission.

However, the emitted light from the device chip(s) may be largely non-directional and non-uniform, which can negatively impact the emission and optical efficiency of a lighting module. Often, a light diffusion lens, light scattering particles, and/or phosphor particles are disposed over the chip(s) to assist in achieving more uniform light emission. A fraction of brightness can be lost when utilizing such means, largely due to back-emission from the emitter, or scattering and back-reflection of light from a light diffusion lens, light scattering particles, and phosphor particles.

To redirect the back-emitted, scattered and/or back-reflected light, reflective materials have been disposed on the substrate of various light emitting devices. The reflective materials may be disposed on only portions of the substrate, or may be disposed as a reflective layer on the substrate. In other attempts to redirect scattered and/or back-reflected light, light-reflective, white printed circuit board (PCB) and/or substrate technology has been developed. The materials used for this existing technology are generally epoxy-based. Epoxy contains free radicals that may yellow during prolonged use and/or common fabrication steps known in the art, such as reflow soldering. Epoxy materials may also degrade in the presence of blue light.

SUMMARY OF THE INVENTION

The present invention provides light emitting devices and methods directed to improved light output. One embodiment comprises a light emitting device with a substrate, a reflective layer at least partially covering the substrate, and one or more light emitting diode chips disposed on the substrate. The reflective layer is substantially non-yellowing.

Pursuant to another embodiment, a light emitting device is provided. The device comprises a substrate and a reflective coating at least partially covering the substrate. The reflective coating comprises a material that is substantially resistant to discoloration over time. One or more light emitting diode (LED) chips are disposed on the substrate.

One embodiment of a light emitting device according to the present invention comprises a substrate with a stable reflective coating at least partially covering the substrate. The reflective coating can comprise a silicone carrier with light reflective particles dispersed in the carrier. One or more LED chips can be disposed on the substrate and a light diffusion lens can be disposed on the substrate and over the LED chips.

Another embodiment of a light emitting device according to the present invention comprises a substrate, and one or more LED chips disposed on the substrate. A light diffusion lens is disposed on the substrate and surrounding the LED chips, with one or more microspheres dispersed in the light diffusion lens. A stable reflective coating is included at least partially covering the substrate.

One embodiment of a method for producing a light emitting device comprises providing a substrate and mounting LED chips to the substrate. A reflective, discoloration resistant coating is applied on at least a portion of the top surface of the substrate, with the coating comprising a carrier with reflective particles dispersed in the carrier.

These and other further features and advantages of the invention would be apparent to those skilled in the art from the following detailed description, taken together with the accompanying drawings, in which:

BRIEF DESCRIPTION OF THE DRAWINGS

FIG. 8 is a top view of a portion of one embodiment of a light emitting device according to the present invention;

FIG. 9 is a schematic side view of a portion of one embodiment of a light emitting device according to the present invention;

FIG. 10 is a schematic view of portion 85 depicted in FIG. 9;

DETAILED DESCRIPTION OF THE INVENTION

Figure 1:
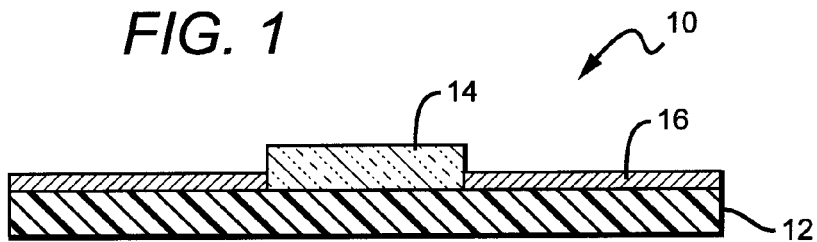
FIG. 1 is a schematic side view of a portion of one embodiment of a light emitting device according to the present invention.

The present invention provides structures and methods for producing light emitting devices, such as multi-chip LED devices that provide high luminous flux output. The electronic elements may include one or more circuit boards with light emitting diodes (LEDs), solar cells, photodiodes, laser diodes, and other such optoelectronic elements or combinations of optoelectronic elements. Several possible embodiments of the present invention are generally directed to light emitting devices incorporating LEDs, but it is understood that other light emitting devices may also be used.

The present invention generally provides devices and methods for light emitting devices for increasing light output using a high reflective coating on a substrate. The coating can effectively redirect light that is back-emitted from the emitter, back-scattered or reflected by a light diffusion lens, light scattering particles, phosphor particles, and/or microspheres. The present invention may also provide embodiments for optimal color mixing for white light emitting devices.

In the embodiments described herein, the coating on the substrate should be robust and stable over time such that it does not degrade in the presence of emitter light or undergo discoloration and/or degradation after elevated temperatures, prolonged use or adverse environmental conditions. The reflective layers according to the present invention are arranged so that the reflective properties of the reflective layer remain substantially constant over time, so that the emitting device retains its emission efficiency over time. In some embodiments, the coating can comprise a carrier with dispersed reflective particles in the carrier, with the carrier and reflective particles having different reflective indexes from one another. In some of these embodiments, the reflective particles are dispersed in the carrier with substantially uniform concentration, although in other embodiments the coating can have different areas of different concentrations to provide different reflective properties. The carrier can be substantially transparent to light from the emitter and in some embodiments can be resistant to yellow discoloration; i.e. is substantially non-yellowing. Other embodiments of the coating according to the present invention can comprise a layer of reflective material on the substrate with a protective coating over the reflective material, with the coating being robust and resistant to discoloration over time. The coating can also be arranged to protect the underlying reflective layer from environmental conditions such as moisture and oxidation.

The present invention is described herein with reference to certain embodiments but it is understood that the invention can be embodied in many different forms and should not be construed as limited to the embodiments set forth herein. In particular, the present invention is described below in regards to light emitting devices having substrates coated by a reflective layer typically comprising moldable silicone with interspersed titanium dioxide and/or alumina particles. However, it is understood that the reflective layer may be coated with other materials for effectively redirecting scattered or back-reflected light. The methods according to the present invention can also be used for coating other semiconductor devices with different materials. Additionally, single or multiple coatings and/or layers can be formed on the substrate and on the LED chips. A coating can include no phosphors, one or more phosphors, scattering particles and/or other materials. A coating may also comprise a material such as an organic dye that provides down-conversion. With multiple coatings and/or layers, each one can include different phosphors, different scattering particles, different optical properties, such as transparency, index of refraction, and/or different physical properties, as compared to other layers and/or coatings.

The present invention is also described herein with reference to reflective coatings that are color stable or substantially resistant to discoloration over time. In some embodiments, the coating can be resistant to yellow discoloration, and can be described as non-yellowing. It is understood that in other embodiments the coatings according to the present invention can be resistant to other colors of discoloration, including but not limited to reddening or blackening.

LEDs can have many different semiconductor layers arranged in different ways and can emit many different colors in different embodiments according to the present invention. LED structures, features, and their fabrication and operation are generally known in the art and only briefly discussed herein. The layers of the LEDs can be fabricated using known processes, with a suitable process being fabrication using metal organic chemical vapor deposition (MOCVD). The layers of the LED chips generally comprise an active layer/region sandwiched between first and second oppositely doped epitaxial layers, all of which are formed successively on a growth substrate. LED chips can be formed on a wafer and then singulated for mounting in a package. It is understood that the growth substrate can remain as part of the final singulated LED or the growth substrate can be fully or partially removed.

It is also understood that additional layers and elements can also be included in the LEDs, including but not limited to buffer, nucleation, contact and current spreading layers as well as light extraction layers and elements. The active region can comprise single quantum well (SQW), multiple quantum well (MQW), double heterostructure or super lattice structures. The active region and doped layers may be fabricated from different material systems, with preferred material systems being Group-III nitride based material systems. Group-III nitrides refer to those semiconductor compounds formed between nitrogen and the elements in the Group III of the periodic table, usually aluminum (Al), gallium (Ga), and indium (In). The term also refers to ternary and quaternary compounds such as aluminum gallium nitride (AlGaN) and aluminum indium gallium nitride (AlInGaN). In a preferred embodiment, the doped layers are gallium nitride (GaN) and the active region is InGaN. In alternative embodiments the doped layers may be AlGaN, aluminum gallium arsenide (AlGaAs), aluminum gallium indium arsenide phosphide (AlGaInAsP), aluminium indium galium phosphide (AlInGaP) or zinc oxide (ZnO).

The growth substrate can be made of many materials such as silicon, glass, sapphire, silicon carbide, aluminum nitride (AlN), gallium nitride (GaN), with a suitable substrate being a 4H polytype of silicon carbide, although other silicon carbide polytypes can also be used including 3C, 6H and 15R polytypes. Silicon carbide has certain advantages, such as a closer crystal lattice match to Group-III nitrides than sapphire and results in Group-III nitride films of higher quality. Silicon carbide also has a very high thermal conductivity so that the total output power of Group-III nitride devices on silicon carbide is not limited by the thermal dissipation of the substrate (as may be the case with some devices formed on sapphire). SiC substrates are available from Cree Research, Inc., of Durham, N.C. and methods for producing them are set forth in the scientific literature as well as in a U.S. Pat. Nos. Re. 34,861; 4,946,547; and 5,200,022.

Furthermore, LEDs may have vertical or lateral geometry as is known in the art. Those comprising a vertical geometry may have a first contact on a substrate and a second contact on a p-type layer. An electrical signal applied to the first contact spreads into the n-type layer and a signal applied to the second contact spreads into a p-type layer. In the case of Group-III nitride devices, it is well known that a thin semitransparent current spreading layer typically covers some or all of the p-type layer. It is understood that the second contact can include such a layer, which is typically a metal such as platinum (Pt) or a transparent conductive oxide such as indium tin oxide (ITO).

LEDs may also comprise a lateral geometry, wherein both contacts are on the top of the LEDs. A portion of the p-type layer and active region is removed, such as by etching, to expose a contact mesa on the n-type layer. A second lateral n-type contact is provided on the mesa of the n-type layer. The contacts can comprise known materials deposited using known deposition techniques.

It will be understood that when an element is referred to as being "on", "connected to", "coupled to" or "in contact with" another element, it can be directly on, connected or coupled to, or in contact with the other element or intervening elements may be present. In contrast, when an element is referred to as being "directly on," "directly connected to", "directly coupled to" or "directly in contact with" another element, there are no intervening elements present. Likewise, when a first element is referred to as being "in electrical contact with" or "electrically coupled to" a second element, there is an electrical path that permits current flow between the first element and the second element. The electrical path may include capacitors, coupled inductors, and/or other elements that permit current flow even without direct contact between conductive elements.

Although the terms first, second, etc. may be used herein to describe various elements, components, regions, and/or sections, these elements, components, regions, and/or sections should not be limited by these terms. These terms are only used to distinguish one element, component, region, or section from another element, component, region, or section. Thus, a first element, component, region, or section discussed below could be termed a second element, component, region, or section without departing from the teachings of the present invention.

Embodiments of the invention are described herein with reference to cross-sectional view illustrations that are schematic illustrations of embodiments of the invention. As such, the actual thickness of components can be different, and variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in natures and their shapes are not intended to illustrate the precise shape of a region of a device and are not intended to limit the scope of the invention.

Figure 2:
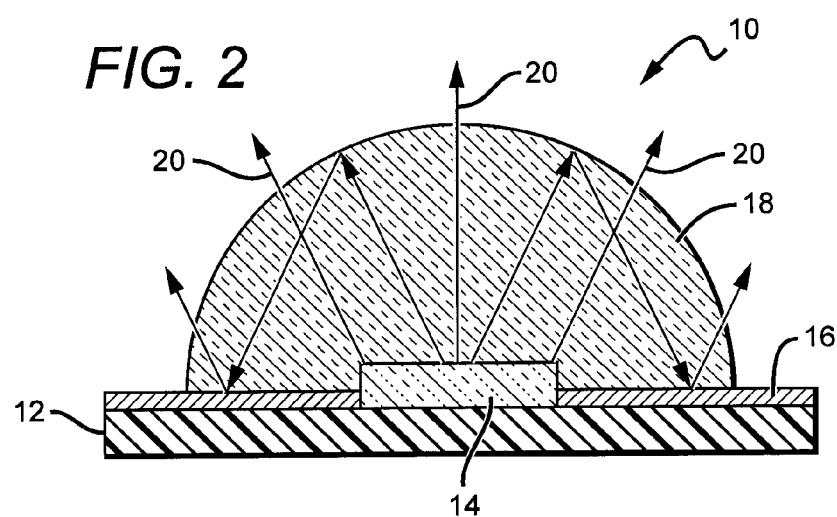
FIG. 2 is a schematic side view of the light emitting device of FIG. 1 with a lens.
Figure 3:
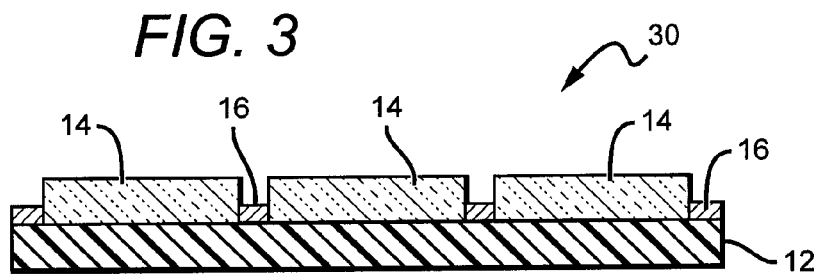
FIG. 3 is a schematic side view of a portion of another embodiment of a light emitting device according to the present invention.
Figure 4:
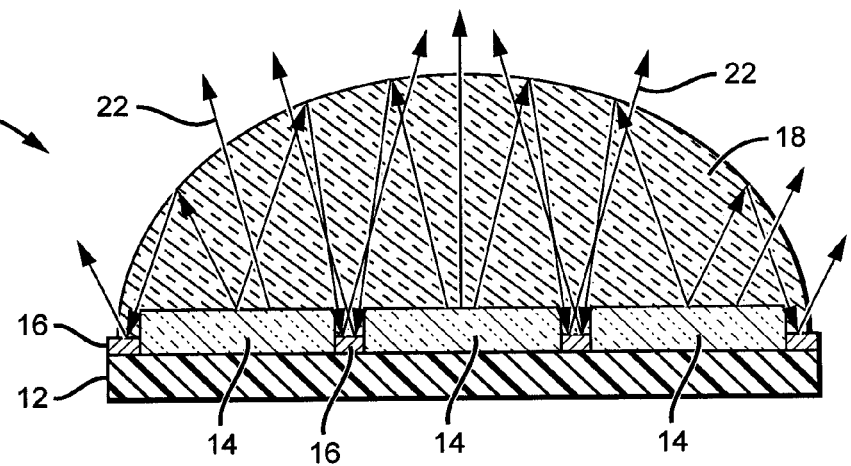
FIG. 4 is a schematic side view of the light emitting device of FIG. 3 with a lens.

FIGS. 1-4 depict a portion of light emitting devices 10, according to one specific embodiment for use in light emitting devices such as LED lamps. The light emitting device portion 10, 30 includes a substrate 12, which may be formed from a variety of acceptable elements such as described above. The substrate 12 may include a circuit layer (such as a printed circuit board) that can be printed and fired over all or a portion of the substrate (not shown). One LED chip 14 (as shown in FIGS. 1-2) or a plurality of LED chips 14 (as shown in FIGS. 3-4) may be mounted on a portion of the substrate 12. While it is understood that any acceptable light emitting device may be mounted on the substrate, LEDs constitute part of one embodiment of a light emitting device according to the present invention, and by way of example and not limitation, will be discussed hereinafter.

The LED chip(s) 14 can also comprise a conductive current spreading structure and wire bond pads on the top surface, both of which are made of a conductive material and can be deposited using known methods. Some materials that can be used for these elements include Au, Cu, Ni, In, Al, Ag or combinations thereof and conducting oxides and transparent conducting oxides. The current spreading structure may comprise conductive fingers arranged in a grid with the fingers spaced to enhance current spreading from the pads into the LED's top surface. In operation, an electrical signal may be applied to the pads through a wire bond, and the electrical signal spreads through the fingers of the current spreading structure and the top surface into the LED chip(s) 14. Current spreading structures are often used in LEDs where the top surface is p-type, but can also be used for n-type materials.

LED chip(s) 14 can be coated with one or more phosphors, with the phosphors absorbing at least some of the LED light and emitting a different wavelength of light such that the LED emits a combination of light from the LED and the phosphor. The LED chip(s) 14 can be coated with a phosphor using many different methods, with one suitable method being described in U.S. patent application Ser. Nos. 11/656,759 and 11/899,790, both entitled "Wafer Level Phosphor Coating Method and Devices Fabricated Utilizing Method", and both of which are incorporated herein by reference. Alternatively the LEDs can be coated using other methods such as electrophoretic deposition (EPD), with a suitable EPD method described in U.S. patent application Ser. No. 11/473,089 entitled "Close Loop Electrophoretic Deposition of Semiconductor Devices", which is also incorporated herein by reference.

As in any arrangement according to embodiments of the present invention, when one or more LED chips are included, any color or color combinations of LEDs may be used to produce a variety of desired effects. Additionally, various anode/cathode pairs may be activated and/or deactivated at any desired time for a variety of varying color effects, combinations, and light intensities. In one embodiment, LED chips 14 can comprise white emitting LEDs with the desired wavelength of light and the desired color temperature, or the LEDs can comprise different LEDs emitting different colors of light that combine to the desired wavelength of light and the desired color temperature. In both arrangements, the light emitting device 10 can emit white light.

In one embodiment, the substrate 12 may be at least partially coated with a high reflective layer/coating 16 to improve reflection of light emitted by the at least one LED chip by reflecting light that is directed toward the substrate that might otherwise be absorbed back at the substrate and/or surrounding structures. The high reflective layer/coating 16 can be arranged effectively to redirect most or all light that is emitted toward the substrate, or is scattered and/or reflected by a light diffusion lens, light scattering particles and/or phosphor particles toward the surface of the substrate 12.

The reflective layer/coating 16 is preferably comprised of a carrier with reflective particles that can be arranged in many different ways. In some embodiments, the reflective particles can be dispersed throughout the carrier. In still other embodiments the coating 16 can comprise a reflective coating with a layer of carrier material over the reflective coating. In some embodiments, the carrier can comprise a material having a reflective index differing from the reflective index of the reflective particles and can also be substantially transparent to light from light emitter. In one embodiment, the carrier may preferably comprise silicone, although it is understood that other materials such as glass, plastics, and/or a polymeric matrix may also be used. It is understood that the carrier can comprise more than one material and can comprise different materials in different layers.

Silicone is a suitable material for use in a reflective layer/coating 16 due at least to its durability, flexibility, ability to withstand high temperatures, and resistance to discoloration. In some embodiments, the silicone coating can exhibit non-yellowing characteristics. The reflective particles can be dispersed throughout the carrier and can comprise many different materials such as titanium oxide and/or aluminum oxide particles, although it is understood that other particles with high reflective properties may also be used. The particles can have many different sizes from sub-micron to many micron sizes. A combination of reflective particles may also be used, and the particles can have a substantially uniform distribution in the carrier or can have areas of differing concentration. In practice, a silicone carrier comprising titanium dioxide reflective particles with alumina and silica coatings exhibits suitable reflective characteristics in the white light range as well as maintaining suitable reflectivity over time and after exposure to high temperatures. The alumina/silica coating aids in the avoidance of photocatalytic degradation reactions in plastic coatings. Alternatively, the substrate 12 can comprise a mirror-like material such that it is substantially reflective, and a transparent material can be coated on the substrate. However, the ability to effectively scatter light in such an arrangement can be decreased.

Different embodiments of the coating can have different resistance to degradation and discoloration over time. In some embodiments, the coating can experience less than 10% discoloration though up to 5,000 hours of operation. In other embodiments, the coating can experience less than 10% degradation through up to 10,000 hours of operation, while in other embodiments the coating can experience less that 10% discoloration through up to 20,000 hours of operation. In still other embodiments, the coating can experience less than 20% discoloration through these different timeframes.

The reflective layer/coating 16 may completely or partially cover portions of the substrate 12 not occupied by the at least one LED chip 14; it is understood that as more of the substrate is covered by reflective layer/coating 16, a larger reflective area is obtained, which can improve the overall reflectivity of the light emitting device 10, 30. For example, a portion of the substrate may be covered by reflective layer/coating 16 such that substantially all of the substrate 12 outside the perimeter of the at least one LED chip 14 is coated (see, e.g. FIG. 7). Alternatively, the substrate may be covered by reflective layer/coating 16 such that substantially all of the substrate 12 both outside the perimeter of the LED chip(s) and between each of the LED chips 14 is coated (see, e.g. FIG. 8). It is understood that allowing the reflective layer/coating 16 to cover the LED chip 14 can be disadvantageous as it would hinder light from most effectively emanating from the LEDs.

As can be seen in FIGS. 2 and 4, a light diffusion lens 18 may be provided over the substrate 12 and LED chip(s) 14. The lens 18 can be formed over the LED chip(s) 14 and substrate 12 using different molding techniques and the lens can be many different shapes depending on the desired shape of the light output. One suitable shape as shown is hemispheric, with some examples of alternative shapes being ellipsoid bullet, flat, hex-shaped and square. Many different materials can be used for the lens such as silicones, plastics, epoxies or glass, with a suitable material being compatible with molding processes. Silicone is suitable for molding and provides suitable optical transmission properties. It can also withstand subsequent reflow processes and does not significantly degrade over time. It is understood that the lens 18 can also be textured to improve light extraction or can contain materials such as phosphors or scattering particles.

The lens arrangement is also easily adapted for use with secondary lens or optics that can be included over the lens by the end user to facilitate beam shaping. These secondary lenses are generally known in the art, with many different ones being commercially available. The lens 18 can also have different features to diffuse or scatter light, such as scattering particles or structures. Particles made from different materials can be used such as titanium dioxide, alumina, silicon carbide, gallium nitride, or glass micro spheres, with the particles dispersed within the lens. Alternatively, or in combination with the scattering particles, air bubbles or an immiscible mixture of polymers having a different index of refraction could be provided within the lens or structured on the lens to provide diffusion. The scattering particles or structures can be dispersed homogeneously throughout the lens 18 or can have different concentrations in different areas of the lens. In one embodiment, the scattering particles can be in layers within the lens, or can have different concentrations in relation to the location of the LED chip(s) 14.

In multi-chip LED devices such as white light sources, it is desirable to achieve a high degree of color mixing of all colors emitted by the device. Light diffusion lenses can be advantageously provided to achieve a high degree of color mixing. However, some of the brightness of such a device, as much as 10-12%, can be lost due to the scattering and back-reflection of light from a light diffusion lens, light scattering particles and structures, and/or phosphor particles. Incorporating the reflective layer/coating 16 can redirect such scattered and/or back-reflected light, and improve the overall light output of the device by as much as 9% or more.

FIGS. 2 and 4 show light paths 20, 22 respectively, which illustrate just a few of the paths that light emitted from the one or more LED chips 14 can travel on. As can be seen, some of the light can be reflected and/or scattered by light scattering means in the light diffusion lens such that it travels back toward the direction of the substrate 12. Without the inclusion of reflective layer/coating 16, such light would be reabsorbed by the substrate and/or surrounding structures, which would reduce the overall brightness of the device. However, by including reflective layer/coating 16, the back-reflected and/or scattered light can be redirected as shown.

Figure 5:
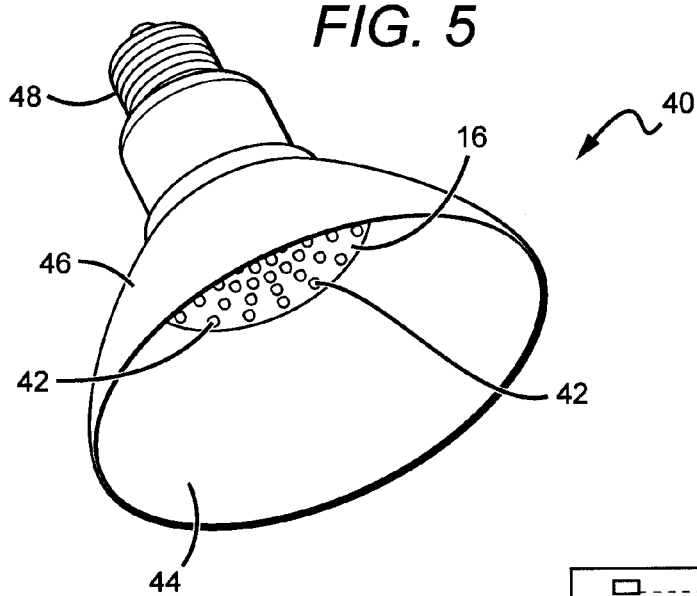
FIG. 5 is a perspective view of one embodiment of an LED lamp according to the present invention.

FIG. 5 shows one possible embodiment of an LED lamp or luminaire 40 according to the present invention. The LED lamp comprises a plurality of LEDs 42, with reflective layer/coating 16 disposed around the perimeter of the LEDs 42, between each of the LEDs 42, or both. Further, the lamp 40 comprises a wall 46 projecting from the main body of the lamp 40, with the wall 46 having an inner surface 44 proximate the plurality of LEDs 42 and reflective layer/coating 16. The inner surface 44 may be coated with a reflective layer similar to layer/coating 16 so as to further optimize the light output of the lamp 40. All or portions of inner surface 44 may be coated with a reflective layer depending on the desired emission effects of the lamp 40. Lamp 40 also comprises a threaded end portion, enabling lamp 40 to be threadedly engaged with a corresponding threaded socket in a light fixture. While lamp 40 depicts one possible configuration for an LED lamp according to the present invention, it is understood that lamp 40 is provided merely as one possible example, and other shapes, sizes, and configurations for lamps are contemplated by the present invention.

Figure 6:
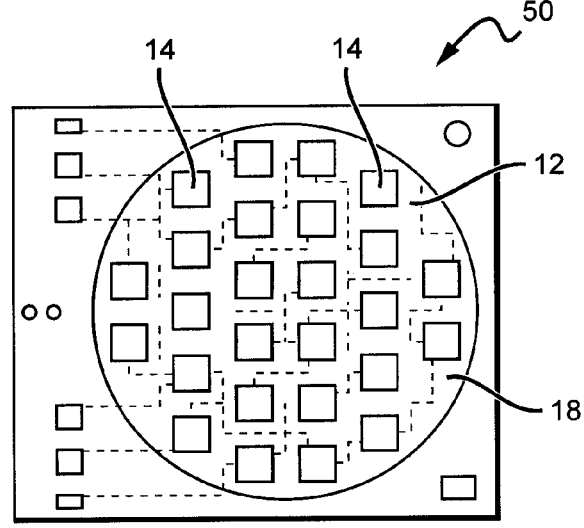
FIG. 6 is a top view of a portion of one embodiment of a light emitting device according to the present invention.

FIG. 6 depicts an overhead view of a portion of a light emitting device 50 according to the present invention. This depiction of a light emitting device provides one example of a substrate 12 with a printed circuit board, with substrate 12 not being covered by a reflective layer/coating. A plurality of LED chips 14 are shown, with various conductive traces and wire bonds allowing electrical connection among and between the various LED chips. A light diffusion lens 18 is disposed over the substrate 12 and LED chips 14. Without a reflective layer/coating covering at least a portion of the substrate, light reflected from the LEDs can be scattered and back-reflected by the light diffusion lens and various light scattering particles and/or phosphor particles, with some of the light being absorbed by the substrate and various other structure among the LED chips.

Figure 7:
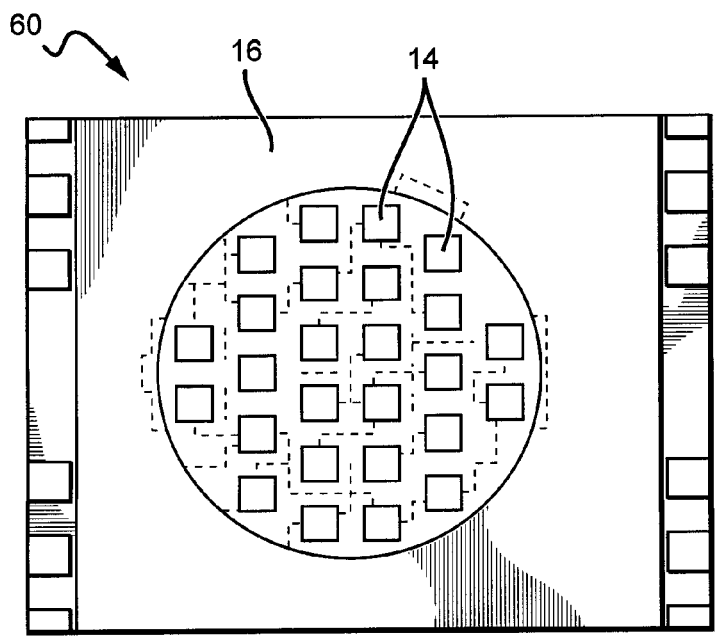
FIG. 7 is a top view of a portion of one embodiment of a light emitting device according to the present invention.

FIG. 7 depicts an overhead view of a portion of a light emitting device 60 according to the present invention. This depiction of a light emitting device provides one example of a substrate 12 with a printed circuit board, with substrate 12 being at least partially covered by a reflective layer/coating such that the substrate is covered by layer 16 around the perimeter of a plurality of LED chips 14. By way of example and not limitation, the reflective layer/coating 16 may coat approximately 60% of the surface area at the top of the substrate 12, which may increase the overall luminous flux of light emitting device 60 by ~4-5%. In other embodiments the reflective layer/coating can cover greater than 60% of the top surface of the substrate. In other embodiments it can cover more than 70% of the surface, and in still other embodiments it can cover more that 80% of the surface.

FIG. 8 depicts an overhead view of a portion of a light emitting device 70 according to the present invention. This depiction of a light emitting device provides one example of a substrate 12 with a printed circuit board, with substrate 12 being at least partially covered by a reflective layer/coating such that the substrate is covered by layer 16 around the perimeter of a plurality of LED chips 14 and between each of LED chips 14. By way of example and not limitation, the reflective layer/coating 16 may coat approximately 86% of the surface area at the top of the substrate 12, which may increase the overall luminous flux of light emitting device 70 by ~6.7%. Accordingly, it is understood that by coating the substrate both around the perimeter of the LED chips and between each LED chip, the overall luminous flux improvement of the light emitting device 70 is improved over the luminous flux improvement of light emitting device 60.

FIGS. 9-10 depict a portion of a light emitting device 80, 85 according to one specific embodiment for use in light emitting devices such as LED lamps. The light emitting device portion 80 includes a substrate 82, which is similar to substrate 12 as described in more detail above. The substrate 82 may include a circuit layer (such as a printed circuit board) that can be printed and fired over all or a portion of the substrate (not shown). At least one LED chip 84 similar to LED chips 14 described above may be mounted on a portion of the substrate 82.

As can be seen in FIG. 9, a light diffusion lens 86 similar to lens 18 may be provided over the substrate 82 and LED chip(s) 84. Similar to lens 18, lens 86 can have different features to diffuse or scatter light, such as scattering particles 92 or structures (best shown in FIG. 10). In addition to the particles or structures described above for lens 18, light emitting device 80 further comprises microspheres 88 dispersed throughout lens 86, with the microspheres further enhancing the light mixing of the lens 86 and aiding in the reduction of brightness loss. The microspheres are preferably comprised of hollow glass, although it is understood that other suitable materials such as various plastics, metals, or the like may also be used. The microspheres 88 can be dispersed homogeneously throughout the lens 86 or can have different concentrations in different areas of the lens 86.

FIGS. 9 and 10 show light paths 90, which illustrate just a few of the paths that light emitted from LED chip 84 can travel on. As can be seen, some of the light can be reflected and/or scattered by the microspheres 88 in the light diffusion lens such that it travels in multiple paths away from the light emitting device 80, thus increasing the overall luminous flux of the device 80.

Figure 11:
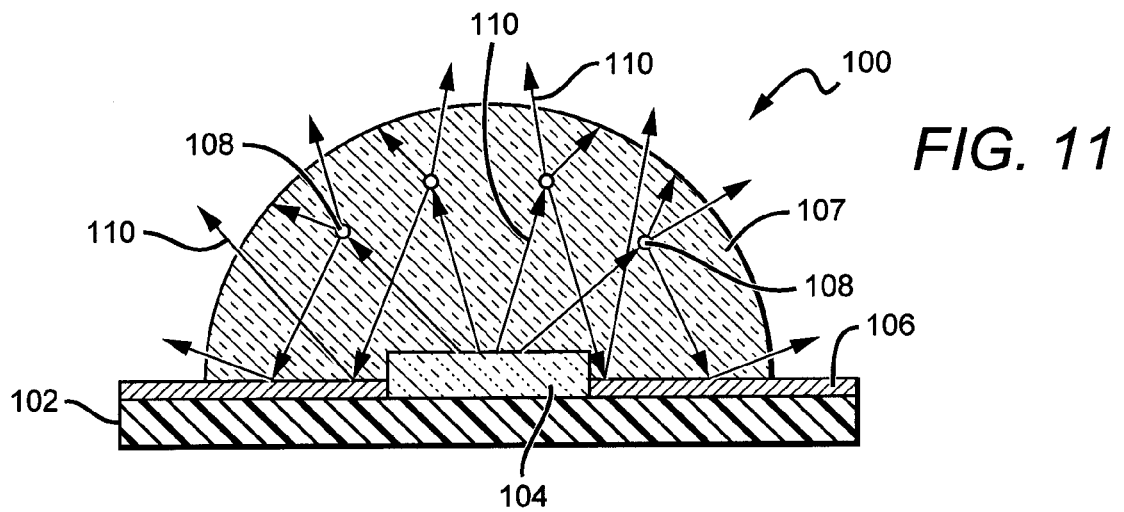
FIG. 11 is a schematic side view of a portion of another embodiment of a light emitting device according to the present invention.
Figure 12:
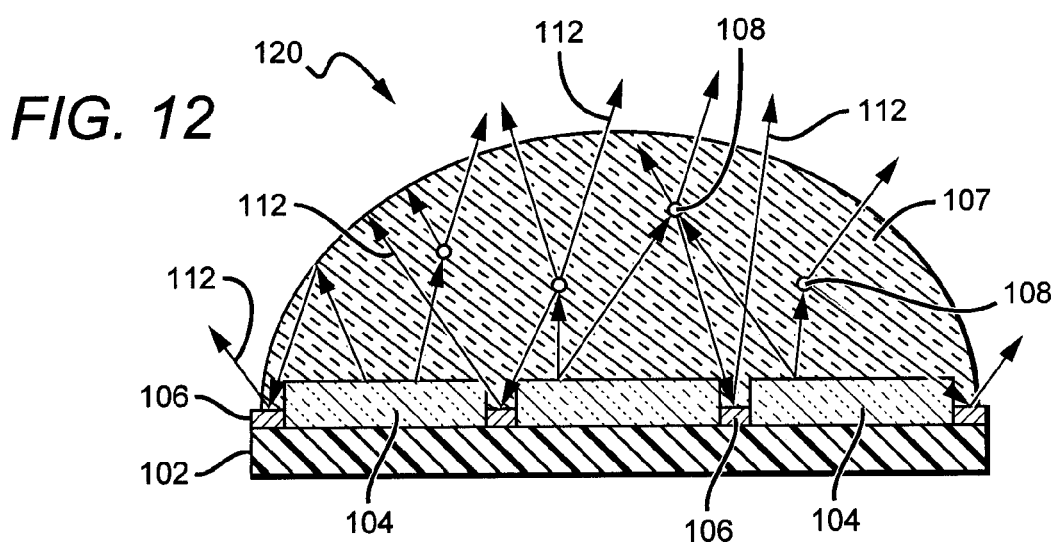
FIG. 12 is a schematic side view of a portion of another embodiment of a light emitting device according to the present invention.

FIGS. 11-12 depict a portion of light emitting devices 100, 120 according to two embodiments for use in light emitting devices such as LED lamps. The light emitting device portions 100, 120 include a substrate 102, which is similar to substrate as described in more detail above. The substrate 102 may include a circuit layer (such as a printed circuit board) that can be printed and fired over all or a portion of the substrate (not shown). One or more LED chips 104, similar to LED chips 14 described above, may be mounted on a portion of the substrate 102. In different embodiments the LED chips and the substrates can be arranged in many different ways.

A light diffusion lens 107, similar to lens 18, may be provided over the substrate 102 and LED chip(s) 104. Similar to lens 18, lens 107 can have different features to diffuse or scatter light, such as scattering particles or structures. In addition to the particles or structures described above for lens 18, light emitting devices 100, 120 further comprise microspheres 110 dispersed throughout lens 107, with the microspheres further enhancing the light mixing of the lens 107 and aiding in the reduction of brightness loss. The microspheres are preferably comprised of hollow glass, although it is understood that other suitable materials such as various plastics, metals, or the like may also be used. The microspheres 110 can be dispersed homogeneously throughout the lens 107, or can have different concentrations in different areas of the lens 107.

In the embodiments shown in FIGS. 11 and 12, the substrate 102 may be at least partially coated with a high reflective layer/coating 106, similar to reflective layer/coating 16 described in detail above, for improving the reflection of light emitted by the at least one LED chip 104 by reflecting light that would have otherwise been absorbed back into the substrate and surrounding structures. The high reflective layer/coating 106 can effectively redirect all light that is scattered and/or reflected by light diffusion lens 107, light scattering particles, microspheres 108, and/or phosphor particles toward the surface of the substrate 102.

FIGS. 11 and 12 further show light paths 110, 112 respectively, which illustrate just a few of the paths that light emitted from LED chip(s) 104 can travel on. As can be seen, some of the light can be reflected and/or scattered by the microspheres 108 in the light diffusion lens such that it travels in multiple paths out of the light emitting devices 100, 120, thus increasing the overall luminous flux of the devices. However, some of the light can be back-reflected and/or scattered by the light scattering means and/or microspheres 108 in the light diffusion lens such that it travels back toward the direction of the substrate 102. Without the inclusion of reflective layer/coating 106, such light would be reabsorbed by the substrate and/or surrounding structures, which would reduce the overall brightness of the device. However, by including reflective layer/coating 106, the back-reflected and/or scattered light can be redirected as shown.

Figure 13:
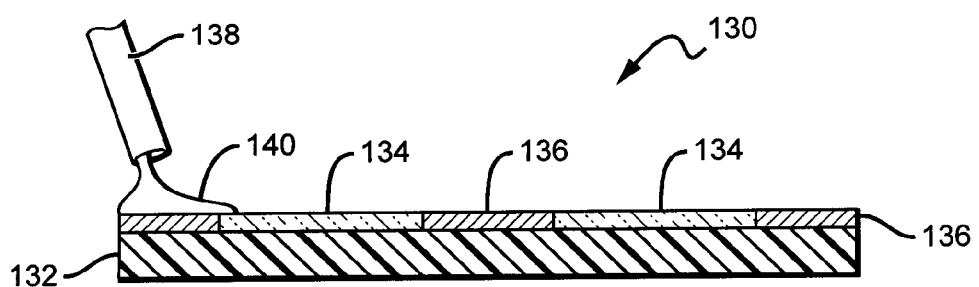
FIG. 13 is a side perspective view of a method for producing a light emitting device according to the present invention.

With reference now to FIG. 13, one possible method 130 for forming light emitting devices with reflective layers according to the present invention is shown. First, a substrate 132 is provided that may be formed from a variety of acceptable materials as described above. The substrate may comprise a circuit layer such as a printed circuit board as described above (not shown), which may be printed and fired on the substrate 132. Then, one or more light emitting devices 134 are coupled with the substrate 132. The light emitting devices are preferably LEDs, although other suitable light emitters may be provided. The light emitting devices may be electrically coupled on the substrate by means of an electrically and thermally conductive interface such as an adhesive, coating, film, encapsulant, paste, grease, solder pad, and/or other suitable material. The light emitting devices may also be flip-chip mounted.

Then, a reflective layer/coating 136 is deposited such that it at least partially covers the substrate 132. The reflective layer/coating 136 is designed to maximize the light emitted from the device and minimize the light absorbed into the substrate and other areas of the light emitting device. The reflective layer/coating 136 preferably comprises a non-yellowing coating on at least a portion of the top surface of the substrate, and may be applied either outside the perimeter of the light emitting devices 134, between each of the light emitting device 134, or both. Furthermore, the reflective layer/coating 136 preferably comprises a carrier with reflective particles dispersed throughout, with the carrier preferably comprised of silicone, although it is understood that other suitable materials such as plastics or glass may also be used. The reflective particles dispersed throughout the carrier preferably comprise titanium dioxide, although it is understood that other suitable materials such as alumina may also be used.

The reflective layer/coating 136 may be applied on the substrate using a variety of appropriate methods well known in the art. For example, the coating may be applied via methods including: printing, spin coating; manually brushing on, and/or utilizing a dispensing mechanism. In FIG. 13, a dispensing mechanism 138 is shown, which can advantageously apply the reflective layer/coating 136 on the substrate and among the light emitting devices 134 without covering the devices 134. The liquid coating 140 flows from the dispensing mechanism 138, and the viscosity of the coating 140 can be adjusted so as to obtain optimal coverage on the substrate. While FIG. 13 depicts one possible method for applying a reflective layer/coating 136, it is understood that are methods known in the art are also contemplated under the present invention. In embodiments having a reflective layer covered by a carrier, the reflective layer can be applied using known processes such as spraying or printing, with the carrier applied using the processes above.

Additionally, an optical element such as a lens or a collimator (not shown) may be provided over the substrate 132 and light emitting devices 134. The optical element is provided to further improve the light reflection of the light emitting devices 134, and can be formed over the substrate 132 and devices 134 using different molding techniques well known in the art. While silicones and/or plastics are the preferred material(s) for the optical element, other materials such as epoxies or glass may also be suitable. The optical element may also have different features to diffuse or scatter light as described above, such as scattering particles, phosphor particles, microspheres, or other structures.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

We claim:
1. A light emitting device, comprising:
a substrate;
a reflective coating comprising a transparent carrier at least partially covering said substrate, with said reflective coating being resistant to discoloration, wherein said reflective coating redirects incident light towards a lens; and
one or more light emitting diode (LED) chips on said substrate, wherein said reflective coating is configured such that the bottom portion of said one or more LED chips remains uncovered by said reflective coating, wherein said reflective coating covers less than all of at least one sidewall of said one or more LED chips.
2. The device of claim 1, wherein said reflective coating is resistant to yellowing.
3. The device of claim 1, wherein said substrate comprises a printed circuit board.
4. The device of claim 1, wherein said reflective coating comprises a carrier, with light reflective particles in said carrier.
5. The device of claim 4, wherein said carrier comprises one or more of silicone, plastic, glass, or a polymeric matrix.
6. The device of claim 4, wherein said light reflective particles comprise one or more of titanium dioxide or aluminum oxide.
7. The device of claim 4, wherein said light reflective particles comprise a reflective index different from the reflective index of said carrier.
8. The device of claim 1, wherein said reflective coating is light transparent, with said reflective coating being non-discoloring and non-degrading over prolonged use, or exposure to blue light.
9. The device of claim 1, wherein said reflective coating covers said substrate outside the perimeter of said LED chips.
10. The device of claim 9, wherein said reflective coating is on said substrate between each of said LED chips.
11. The device of claim 1, further comprising a light diffusing lens on said substrate and LED chips, with said light diffusing lens comprising one or more of light scattering particles, hollow microspheres, or phosphor particles.
12. The device of claim 11, wherein said reflective coating redirects light that is scattered or back-reflected from said light scattering particles, hollow microspheres, or phosphor particles such that said light is effectively emitted from said device, increasing the light output of said device.
13. The device of claim 11, wherein said light diffusing lens comprises one or more of silicone, glass, or plastic.
14. The device of claim 1, wherein said light emitting device emits red light, green light, blue light, yellow light, white light, or any combination thereof.
15. A light emitting device, comprising:
a substrate;
a reflective coating at least partially covering said substrate, with said reflective coating being resistant to discoloration;

one or more light emitting diode (LED) chips on said substrate, wherein said light emitting device comprises an LED lamp; and one or more walls with an interior surface in the light emission paths of said LED chips, said interior surfaces coated with said reflective coating.

16. A light emitting device, comprising:

a substrate;

a stable reflective coating at least partially covering said substrate, said reflective coating comprising a silicone carrier and being resistant to discoloration, wherein said reflective coating redirects incident light towards a light diffusion lens;

light reflective particles in said carrier;

one or more light emitting diode (LED) chips on said substrate, wherein said stable reflective coating is configured such that the bottom portion of said one or more LED chips remains uncovered by said stable reflective coating; and said light diffusion lens on said substrate and over said LED chips;

wherein said light diffusion lens comprises at least one of the group consisting of scattering particles, air bubbles, or microspheres.

17. The device of claim 16, wherein said coating is resistant to yellowing through use.

18. The device of claim 16, wherein said light emitting reflective particles comprise one or more of titanium dioxide or aluminum oxide.

19. The device of claim 16, wherein said reflective coating covers said substrate outside the perimeter of said LED chips or is on said substrate between each of said LED chips and outside the perimeter of said LED chips.

20. The device of claim 16, wherein said light diffusion lens comprises one or more of light scattering particles, phosphor particles, or hollow microspheres.

21. The device of claim 16, wherein said light diffusion lens comprises one or more of silicone, plastic, or glass.

22. A light emitting device, comprising:

a substrate;

one or more light emitting diode (LED) chips on said substrate;

a light diffusion lens on said substrate and surrounding said LED chips;

one or more microspheres in said light diffusion lens; and a stable reflective coating at least partially covering said substrate, said reflective coating resistant to discoloration, wherein said reflective coating redirects incident light towards the light diffusion lens, wherein said stable reflective coating is configured such that the bottom portion of said one or more LED chips remains uncovered by said stable reflective coating.

23. The device of claim 22, wherein said reflective coating comprises a carrier which is transparent to light from at least one of said LED chips, and a reflective material.

24. The device of claim 22, wherein said reflective coating at least partially covers said substrate.

25. A light emitting device, comprising:

a substrate;

one or more light emitting diode (LED) chips on said substrate;

a light diffusion lens on said substrate and surrounding said LED chips;

one or more microspheres in said light diffusion lens, wherein said microspheres comprise hollow glass, said microspheres enhancing the light scattering and mixing of light emitted by said LED chips; and a stable reflective coating at least partially covering said substrate, wherein said reflective coating redirects incident light towards the light diffusion lens, wherein said stable reflective coating is configured such that the bottom portion of said one or more LED chips remains uncovered by said stable reflective coating.

26. The device of claim 22, wherein said reflective coating comprises a silicone carrier, with one or more of titanium dioxide or aluminum particles in said carrier.

27. The device of claim 22, wherein said light diffusion lens further comprises one or more of light scattering particles or phosphor particles.

28. A method for producing a light emitting device, said method comprising:

providing a substrate;

mounting one or more light emitting diode (LED) chips to said substrate; and applying a reflective, discoloration resistant coating on at least a portion of the top surface of said substrate such that the bottom portion of said one or more LED chips remains uncovered by said stable reflective coating, said coating comprising a transparent carrier with reflective particles in said carrier, wherein said reflective coating redirects incident light towards a lens.

29. The method of claim 28, further comprising disposing a light diffusion lens on said substrate and LED chips, said light diffusion lens comprising one or more of scattering particles, hollow microspheres, or phosphor particles.

30. The method of claim 28, wherein said carrier comprises one or more of silicone, plastic, or glass, and said reflective particles comprise one or more of titanium dioxide or aluminum oxide.

31. The method of claim 28, further comprising applying said coating on said substrate outside the perimeter of said LED chips or between each of said LED chips as well as outside the perimeter of said LED chips.

32. The method of claim 28, further comprising applying said coating on said substrate by one or more of the following methods: printing, brushing on, or utilizing a dispensing mechanism.

* * * * *